(12) United States Patent
Gardner et al.

(10) Patent No.: US 11,139,213 B2
(45) Date of Patent: Oct. 5, 2021

(54) METHOD OF MAKING 3D SOURCE DRAINS WITH HYBRID STACKING FOR OPTIMUM 3D LOGIC LAYOUT

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 16/845,868

(22) Filed: Apr. 10, 2020

(65) Prior Publication Data
US 2021/0143065 A1 May 13, 2021

Related U.S. Application Data

(60) Provisional application No. 62/934,702, filed on Nov. 13, 2019.

(51) Int. Cl.
| | |
|---|---|
| *H01L 21/8238* | (2006.01) |
| *H01L 27/06* | (2006.01) |
| *H01L 27/11* | (2006.01) |
| *H01L 27/092* | (2006.01) |

(52) U.S. Cl.
CPC ........... *H01L 21/823807* (2013.01); *H01L 21/823814* (2013.01); *H01L 21/823871* (2013.01); *H01L 27/0688* (2013.01); *H01L 27/092* (2013.01); *H01L 27/1104* (2013.01)

(58) Field of Classification Search
CPC ..... H01L 21/823807; H01L 21/823814; H01L 21/823871; H01L 27/0688; H01L 27/092; H01L 27/1104
USPC .......................................................... 438/199
See application file for complete search history.

(56) References Cited

U.S. PATENT DOCUMENTS

| | | | |
|---|---|---|---|
| 9,935,204 B2 | 4/2018 | Lee et al. | |
| 9,991,261 B2 | 6/2018 | Mitard | |
| 10,263,100 B1 | 4/2019 | Bi et al. | |
| 10,374,099 B2 | 8/2019 | Lee et al. | |
| 10,388,569 B1 | 8/2019 | Cheng et al. | |
| 10,516,064 B1* | 12/2019 | Cheng ............. | H01L 21/823412 |
| 10,553,678 B2 | 2/2020 | Lee et al. | |
| 10,573,561 B2 | 2/2020 | Cheng et al. | |
| 10,658,462 B2 | 5/2020 | Lee et al. | |
| 10,741,676 B2 | 8/2020 | Lee et al. | |
| 2017/0040321 A1* | 2/2017 | Mitard ............. | H01L 29/66439 |
| 2017/0162583 A1 | 6/2017 | Lee et al. | |
| 2018/0190835 A1 | 7/2018 | Lee et al. | |
| 2019/0058036 A1* | 2/2019 | Smith ............. | H01L 21/823431 |

(Continued)

OTHER PUBLICATIONS

International Search Report and Written Opinion dated Jan. 29, 2021 in PCT/US2020/054686, 9 pages.

*Primary Examiner* — Igwe U Anya
(74) *Attorney, Agent, or Firm* — Oblon, McClelland, Maier & Neustadt, L.L.P.

(57) ABSTRACT

Methods for 3D fabrication of source/drain regions in different stacks of 3D transistors in which multiple planes are fabricated simultaneously are described. The methods allow any sequence of 3D source/drains to be made to customize the logic layout for a given 3D logic circuit or design. Examples are described of forming a stacked SRAM device, a dual stacked SRAM device and a plurality of stacked inverters based on NMOS and PMOS field effect transistors.

20 Claims, 32 Drawing Sheets

(56) References Cited

U.S. PATENT DOCUMENTS

2019/0131395 A1 5/2019 Lee et al.
2019/0319137 A1 10/2019 Lee et al.
2019/0393091 A1 12/2019 Cheng et al.
2020/0020768 A1 1/2020 Lee et al.
2020/0144122 A1 5/2020 Cheng et al.
2020/0357932 A1 11/2020 Lee et al.

* cited by examiner

METHOD OF MAKING 3D SOURCE DRAINS WITH HYBRID STACKING FOR OPTIMUM 3D LOGIC LAYOUT

CROSS REFERENCE TO RELATED PATENTS AND APPLICATIONS

This application claims priority to and the benefit of the filing date of U.S. Provisional Patent Application Ser. No. 62/934,702 filed Nov. 13, 2019, which application is incorporated herein by reference in its entirety.

BACKGROUND OF THE INVENTION

Field of the Invention

This disclosure relates to integrated circuits and the fabrication of 3D microelectronic devices.

SUMMARY OF THE INVENTION

Aspects of the present disclosure provide methods for 3D fabrication of multiple source/drain regions in different stacks of 3D transistors. That is, multiple planes can be fabricated simultaneously. Methods of fabrication are herein described to allow any sequence of 3D source/drains to be made to customize the logic layout for a given 3D logic circuit or design.

The first embodiment describes a method forming a plurality of nano-channel stacks on a substrate, each nano-channel stack including a plurality of nano-channels parallel to a surface plane of the substrate and aligned along a second plane perpendicular to the surface plane of the substrate, wherein each nano-channel of a stack is spaced apart from each other nano-channel of the stack, wherein each nano-channel has opposing ends, wherein the plurality of nano-channel stacks are covered by a fill material, removing the fill material from at least one first nano-channel stack while at least one second nano-channel stack remains covered with the fill material, forming first source/drain regions on the opposing ends of the at least one first nano-channel stack by an epitaxial growth process including a first dopant or a second dopant, depositing a protective film on the first source/drain regions by a first selective deposition process which deposits the protective film on the first source/drain regions without depositing the protective film on other surfaces, from a top-down direction, removing the fill material from a first portion of the opposing ends of the at least one second nano-channel stack, while one or more nano-channels positioned beneath the first portion remain covered, forming second source/drain regions on the first portion by the epitaxial growth process including a first or a second dopant, depositing the protective film on the second source/drain regions by a second selective deposition process which deposits the protective film on the first source/drain regions without depositing the protective film on other surfaces, from the top-down direction, removing the fill material from a second portion of the opposing ends of the second nano-channel stack such that the opposing ends of at least one additional nano-channel are uncovered, forming third source/drain regions on the second portion by the epitaxial growth process including the first dopant or the second dopant, and removing the protective film.

The second embodiment describes a method of fabricating a 3D stacked inverter, the method comprising forming a plurality of nano-channel stacks on a substrate, each nano-channel stack including a plurality of nano-channels parallel to a surface plane of the substrate and aligned along a second plane perpendicular to the surface plane of the substrate, wherein each nano-channel is spaced apart from each other nano-channel, wherein each nano-channel has opposing ends, wherein the plurality of nano-channel stacks are covered by a fill material, removing the fill material from a first nano-channel stack while a second nano-channel stack remains covered with the fill material, forming first source/drain regions on nano-channel ends of the first nano-channel stack by a first epitaxial growth process and a first dopant, depositing a protective film on the first source/drain regions by a selective deposition process that deposits on the first source/drain regions without depositing the protective film on other surfaces, removing the fill material from the second nano-channel stack, forming second source/drain regions on the opposing ends of the second nano-channel stack by a second epitaxial growth process and a second dopant, and removing the protective film.

The third embodiment describes a method of fabricating a 3D stacked semiconductor device, the method comprising forming a plurality of nano-channel stacks on a substrate, each nano-channel stack including a plurality of nano-channels parallel to a surface plane of the substrate and aligned along a second plane perpendicular to the surface plane of the substrate, wherein each nano-channel is spaced apart from each other nano-channel, wherein each nano-channel has opposing ends, wherein the plurality of nano-channel stacks are covered by a fill material. The method of the third embodiment further comprises, in a top-down direction, removing the fill material from the opposing ends of a first portion of a first nano-channel stack while the opposing ends of the nano-channels positioned beneath the first portion remain covered with the fill material, forming first source/drain regions on the opposing ends of the first portion by epitaxial growth while doping the first source/drain regions with a first dopant or a second dopant, depositing a protective film on the first source/drain regions by a first selective deposition process that deposits the protective film on the first source/drain regions without depositing the protective film on other surfaces. From the top-down direction, removing the fill material from a second portion of the opposing ends of the first nano-channel stack while the opposing ends of nano-channels positioned beneath the second portion remain covered, forming second source/drain regions on the opposing ends of the second portion of the first nano-channel stack by epitaxial growth while doping the second source/drain regions with the first dopant or the second dopant, depositing the protective film on the second source/drain regions by a second selective deposition process that deposits the protective film on the second source/drain regions without depositing the protective film on other surfaces. From the top-down direction, removing the fill material from a third portion of the first nano-channel stack that uncovers the opposing ends of one or more third nano-channels, forming third source/drain regions on uncovered nano-channel ends of the third portion of the first nano-channel stack by epitaxial growth while doping the third source/drain regions with the first dopant or the second dopant, and removing the protective film from all source/drain regions of the first nano-channel stack.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the detailed description section and corresponding figures of the present disclosure as further discussed below.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
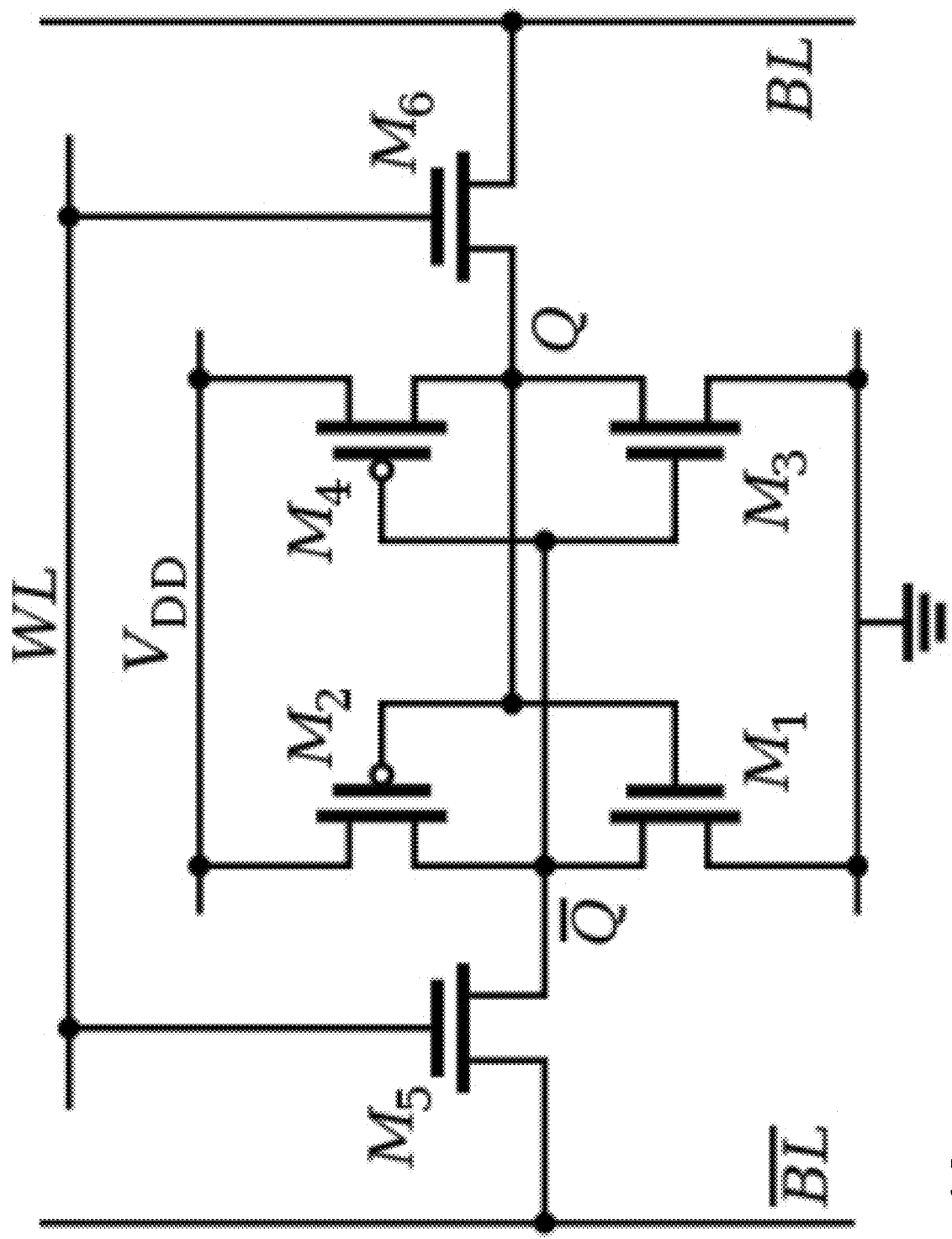
FIG. 1A depicts the circuit diagram of an SRAM cell.

In the drawings, like reference numerals designate identical or corresponding parts throughout the several views. Further, as used herein, the words "a," "an" and the like generally carry a meaning of "one or more," unless stated otherwise. The drawings are not generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Further, spatially relative terms, such as "beneath," "below," "lower," "above," "upper" "top" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

In the field of semiconductor production, the contacted gate pitch of two-dimensional transistor density scaling reaches its scaling limit due to manufacturing variability and electrostatic device limitations. New transistor designs, such as vertical channel gate-all-around transistors, may be able to overcome some contacted gate pitch scaling limits, however, resistance, capacitance, and reliability concerns limit wire pitch scaling, thereby limiting the density with which transistors can be wired into circuits.

3D integration is an option for overcoming the inevitable saturation in critical dimension scaling. 3D integration, i.e. the vertical stacking of multiple devices, may overcome these scaling limitations by increasing transistor density in volume rather than area. Vertical stacking has been successfully demonstrated and implemented by the flash memory industry with the adoption of 3D NAND. Mainstream CMOS VLSI scaling, as used for example in CPU or GPU products, is investigating 3D integration as a primary means of moving the semiconductor roadmap forward, and thus requires enabling technologies.

During the manufacture of a semiconductor device (especially on the microscopic scale), various fabrication processes are executed, such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication.

A FinFET (fin field-effect transistor) is an example of a non-planar transistor, or "2D" transistor. The FinFET is a variation on traditional metal oxide semiconductor field effect transistors (MOSFETs) distinguished by the presence of a thin silicon "fin" inversion channel on top of the substrate, allowing the gate to make two points of contact: the left and right sides of the fin. The thickness of the fin (measured in the direction from source to drain) determines the effective channel length of the device. The wrap-around gate structure provides better electrical control over the channel, reducing the leakage current and overcoming other short-channel effects.

A gate-all-around (GAAFET), is a non-planar 3D transistor which is similar in concept to a FinFET except that the gate material surrounds the channel region on all sides. Depending on design, gate-all-around FETs can have two or more effective gates. Gate-all-around FETs may utilize a stack of silicon nanowires with a gate completely surrounding it.

The gate-all-around assembly resembles a MOSFET, where a gate is sandwiched between the source and a drain and has fins similar to a FinFET. A gate-all-around FET may incorporate three or more nanowires. The nanowires, which form the channels, are suspended and run from the source to the drain.

Scaling efforts have greatly increased the number of transistors per unit area in 2D circuits, yet scaling efforts have run into greater challenges as scaling enters single digit nanometer semiconductor device fabrication nodes. Progress in semiconductor device fabrication requires three-dimensional (3D) semiconductor circuits in which transistors are stacked on top of each other.

3D integration, i.e. the vertical stacking of multiple devices, aims to overcome the scaling limitations experienced in planar devices by increasing transistor density in volume rather than area. Although device stacking has been successfully demonstrated and implemented by the flash memory industry with the adoption of 3D NAND, application to random logic designs is substantially more difficult.

Logic devices routinely require inverters, that is, a PMOS (p-type metal-oxide semiconductor) adjacent to a NMOS (n-type metal-oxide semiconductor). Accordingly, it is advantageous to have the ability to place different source/drain (S/D) regions on different nanoplanes.

Formation of source/drain (S/D) regions is performed by epitaxial growth on the ends of nano-channels in the vertical stacks. Epitaxy refers to a type of crystal growth or material deposition in which new crystalline layers are formed with a well-defined orientation with respect to the crystalline substrate. Epitaxial silicon is usually grown using vapor-phase epitaxy (VPE), a modification of chemical vapor deposition. An epitaxial layer can be doped during deposition by adding impurities to the source gas, such as arsine, phosphine, or diborane. The concentration of impurity in the gas phase determines its concentration in the deposited film.

Aspects of the present disclosure describe 3D logic devices with inverter planes, such as SRAM (static random-access memory) cells. Three examples with detailed process and cross-sections of the cells are shown.

Example 1 is a 3D SRAM cell stacked vertically.

Example 2 is a 3D stack consisting of two completed SRAM cells stacked vertically.

Example 3 is a 3D inverter stack which is six tiers tall.

The SRAM cell of Example 1 requires two inverter planes and one plane of NMOS. The circuit diagram of a six-transistor CMOS SRAM cell is shown in FIG. 1A. The SRAM cell includes transistors $M_1$-$M_6$. FIG. 1B to FIG. 9 show the process flow for building the CMOS SRAM cell.

FIG. 1A is the circuit diagram of an SRAM cell which has two inverters ($M_1$ in series with $M_2$ and $M_3$ in series with $M_4$) and two pass transistors ($M_5$ and $M_6$) that comprise the SRAM cell. WL refers to a "word line" and BL refers to a "bit line". $\overline{BL}$ denotes a bit line of the same magnitude as BL, but of opposite polarity. Note that the gates of pass transistors $M_5$ and $M_6$ are connected to the word line, WL, and the gates of $M_1$ and $M_2$ are in series and connected to bit line BL. The gate of $M_2$ inverts the signal from the bit line BL (as passed by $M_6$ upon a signal from WL), thus either $M_1$ is ON or $M_2$ is ON, depending on the polarity of the signal on BL. Similarly, the gates of $M_3$ and $M_4$ are in series and connected to bit line $\overline{BL}$. The gate of $M_4$ inverts the signal from the bit line BL (as passed by $M_5$ upon a signal from WL), thus either $M_3$ is ON or $M_4$ is ON, depending on the polarity of the signal on $\overline{BL}$. VDD and ground will be connected to the SRAM cell by buried power rails (BPR) within the cell. Note that $M_2$ and $M_4$ are PMOS devices and $M_1$, $M_3$, $M_5$ and $M_6$ are NMOS devices. However, this configuration may be reversed so the that $M_2$ and $M_4$ are NMOS devices and $M_1$, $M_3$, $M_5$ and $M_6$ are PMOS devices.

A benefit of the methods provided herein is to provide logic elements in a mixed 3D stack of different NMOS and PMOS configurations for use in 3D layouts, thus permitting combinations of S/D stacking to make designed logic elements. Other logic elements may use a mixed 3D stack of different NMOS and PMOS configurations in a 3D layout, permitting combinations of S/D stacking to be connected as needed to make desired logic elements. Aspects of the present disclosure describe a dual stack SRAM cell for S/D formation.

Aspects of the present disclosure include stacking relatively large numbers of S/Ds to make an effective 3D structure. This is accomplished with greater control of thermal budget because fewer epitaxial steps are executed to make S/D regions. Aspects of the present disclosure describe a dual stacked 3D SRAM CELL with effective layout and processing for S/D regions.

Figure 1B:
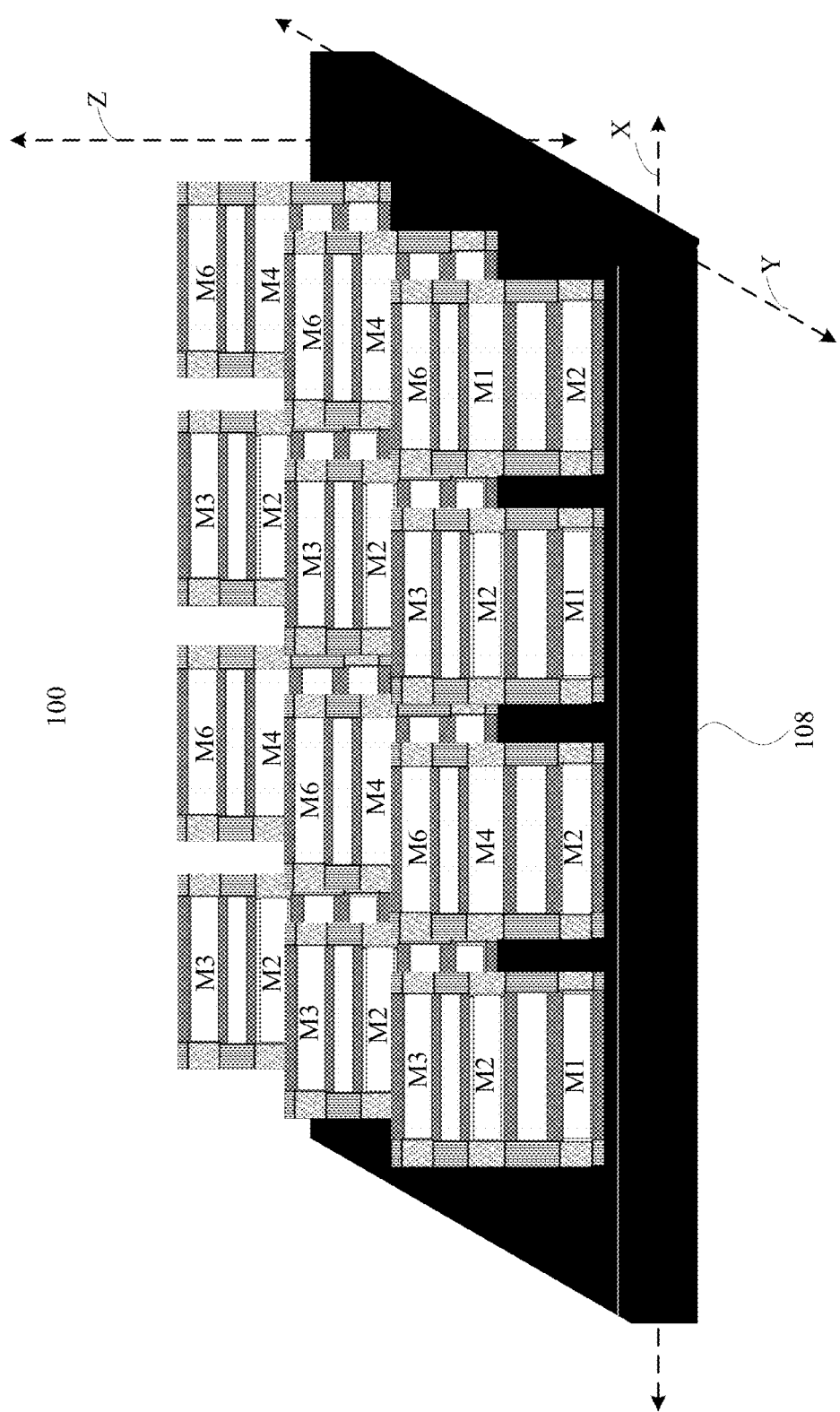
FIG. 1B illustrates a plurality of 3D stacks on a substrate.

Nano-channels refer to either nano-sheets or nano-wires. These are semiconductor channels that are part of a field-effect transistor (FET) that is a gate-all-around (GAA) device in that gate material is or will be formed on all around a cross-section of the channel. Channels can be round, square, rectangular or other shapes. Nano-channels can be formed by epitaxial growth. For example, a first epitaxial stack is formed on a topside surface of a first substrate. For example, a CFET (complementary FET) process flow can be followed up by post nano-stack epi growth. In one example embodiment, up to about 12 or more alternating silicon germanium (SiGe) and silicon monoplane stacks are formed. Note that fewer than 12 layers can be formed. Next, the epitaxial stacks can be cut into fin structures using an etch mask. SiGe material can be optionally removed and replaced with a dielectric. Doping of channel materials can be accomplished before or after the formation of source/drains. The result is that vertical stacks of GAA channels may be formed on a substrate as shown in FIG. 1B. Although the figures show only two stacks, there may be a plurality of stacks formed by the processes of the present disclosure. For example, there may be a second set of stacks extending behind and/or extending to the right and/or the left of the first set of stacks as shown in FIG. 1B. FIG. 1C, FIG. 1D-FIG. 27 illustrate the processing of two adjacent stacks for the sake of clarity and are not to be construed as limiting the number of stacks which can be formed on the substrate and processed by the methods of the present disclosure.

Figure 1C:
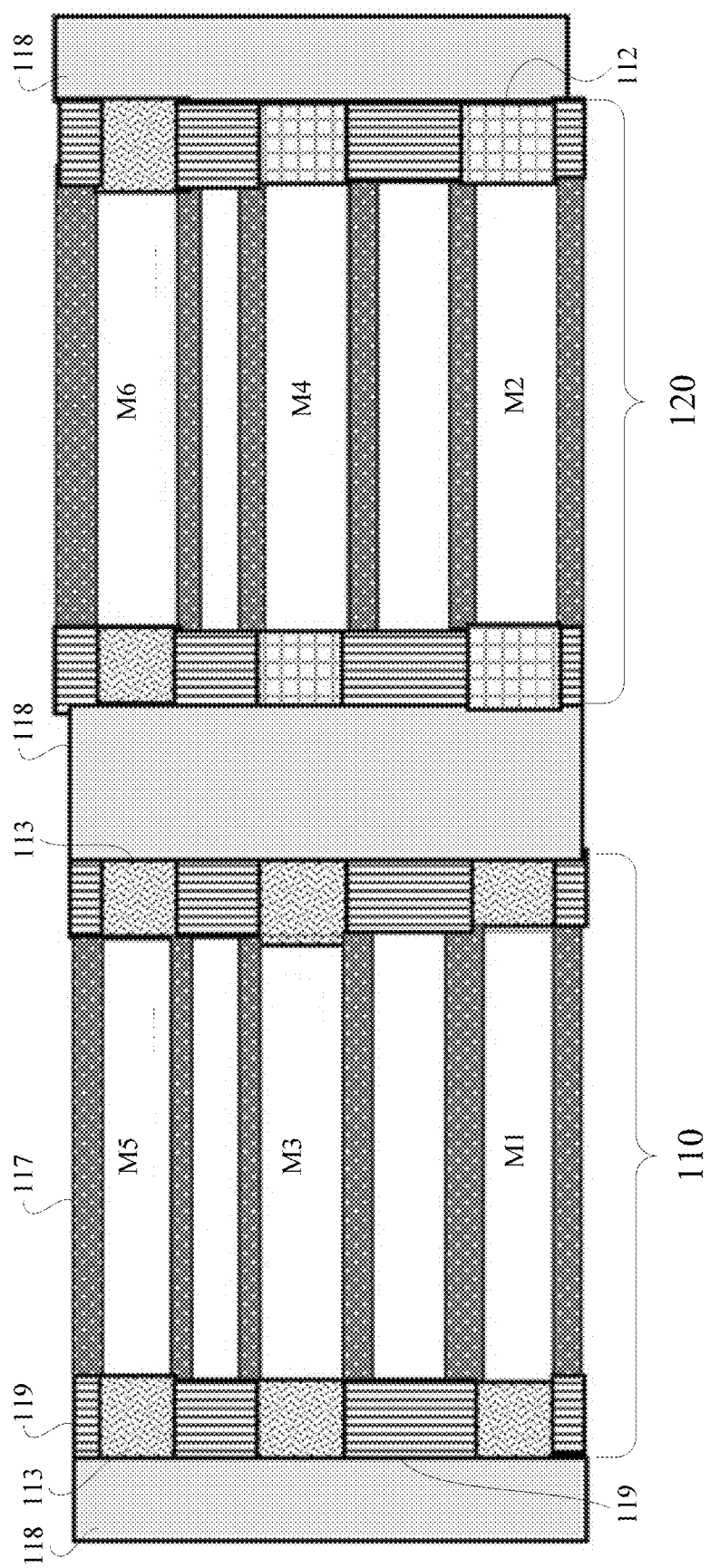
FIG. 1C illustrates a vertically stacked 3D cell.

Referring now to FIG. 1C, FIG. 1D-9, cross-sectional substrate segments illustrate the process flow of forming a vertically stacked 3D SRAM cell. FIG. 1C shows a cross-section of an SRAM cell having stacked nano-channels connected to S/D regions which form the transistors $M_1$-$M_6$ of FIG. 1A. In a first process step, nano-channels (M1-M6) are formed followed by oxide deposition and polish. The nano-channels (M1-M6) of FIG. 1C represent the channels of transistors ($M_1$-$M_6$) of FIG. 1A. On either end of a nano-channel is a source or a drain region. In FIG. 1C, 113 is an area of stack 110 in which a future N+ source or drain region will be formed. Correspondingly, 112 is an area of stack 120 in which a future P+ S/D region will be formed.

In FIG. 1C, each channel may have a different material composition and doping, or may have uniform materials. Channels may have a gate protection material 117 formed thereon for subsequent replacement with a functional gate which fully surrounds each nano-channel. In a non-limiting example, the gate protection material may be a high-K dielectric. In a non-limiting example, the high-K dielectric may be selected from the group of hafnium silicon oxide (HfSiO), hafnium oxide ($HfO_2$), hafnium chromium oxide (HfCrO), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), scandium (III) oxide $Sc_2O_3$, lanthanum oxide $La_2O_3$, lutetium oxide $Lu_2O_3$, niobium (V) oxide $Nb_2O_5$, tantalum pentoxide $Ta_2O_5$, or a combination thereof. Spaces between nano-channel stacks can be filled with oxide 118 fill material or other dielectric. In a non-limiting example, the fill material may be SiO, SiO2, silicon nitride, nitride oxide, or other dielectrics. The other dielectrics may be low or high K dielectrics, where K is in the range of 1.5 to 3.0. Some examples are derivatives of oxides such as fluorine (F) doped oxides, carbon (C) doped oxides, hafnium (H) doped oxides or vapor deposited organic materials, such as polyimides, or highly porous oxides, such as hafnium silicate ($HfSiO_4$), zirconium silicate ($ZrSiO_4$), and barium titanate ($BaTiO_3$).

Additionally, nano-channel ends may designate either a future N+ S/D 113 region or future P+ S/D region 112. An N+ S/D region may be formed by epitaxial growth of silicon in An inner spacer 119 separates each respective nano-channel from an adjacent nano-channel, that is, M1 from M3, M3 from M5, M2 from M4, and M4 from M6.

of the elements of the figures FIG. 1C, FIG. 2-FIG. 27 is listed below. These numbers are identified as:
112 represents a future P+ S/D region,
113 represents a further N+ S/D region,
114 represents a P+ epitaxial S/D region,
115 represents an N+ epitaxial S/D region,
116 represents an S/D protective deposit, which may be a high K material,
117 represents a gate region protective deposit,
118 represents an oxide filler,
119 represents an inner spacer which separates the nano-channels, and
122 represents a photoresist etch mask.

Figure 1D:
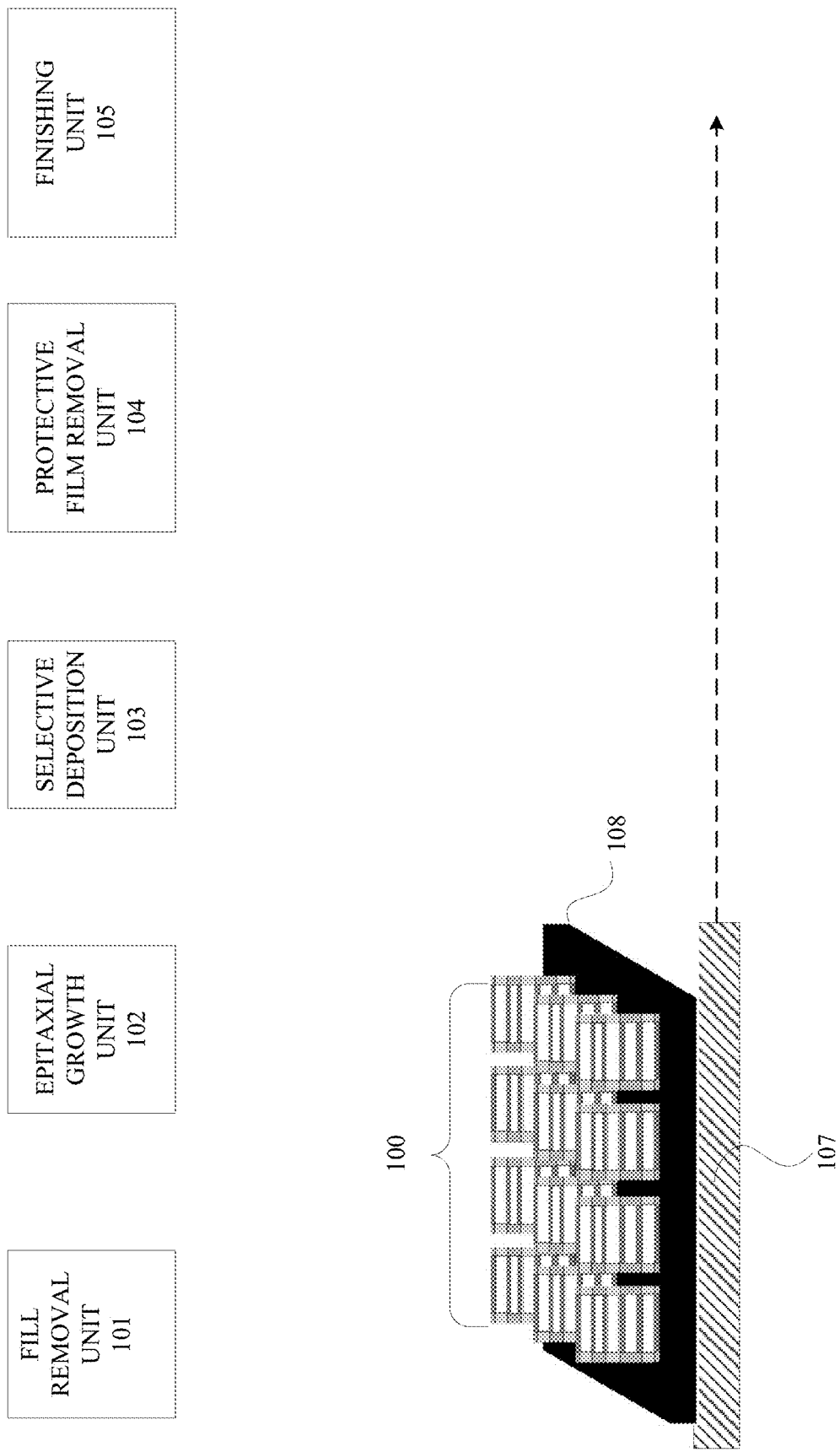
FIG. 1D illustrates a processing unit for forming 3D stacked circuits.

FIG. 1D illustrates the processing stages needed to form the circuits of the present disclosure. The plurality of stacks 100 have been formed on substrate 108, which is held by workpiece 107. Workpiece 107 translates past different processing units (101-105), or alternatively, the processing units are moved over the workpiece. Fill removal unit is configured to remove oxide from the stacks. Epitaxial growth unit 102 is configured to grow source/drain (S/D) regions on the exposed nano-channel ends. Selective deposition unit 103 is configured to deposit a protective film on completed S/D regions to protect them from further processing steps. Protective film removal unit 104 is configured to remove the protective film from the stacks. The finishing unit 105 represents a series of stages which form metallization on the stacks. A control system (not shown) operates the movement of the workpiece 107 and the actuation and control of the processing units.

Figure 2:
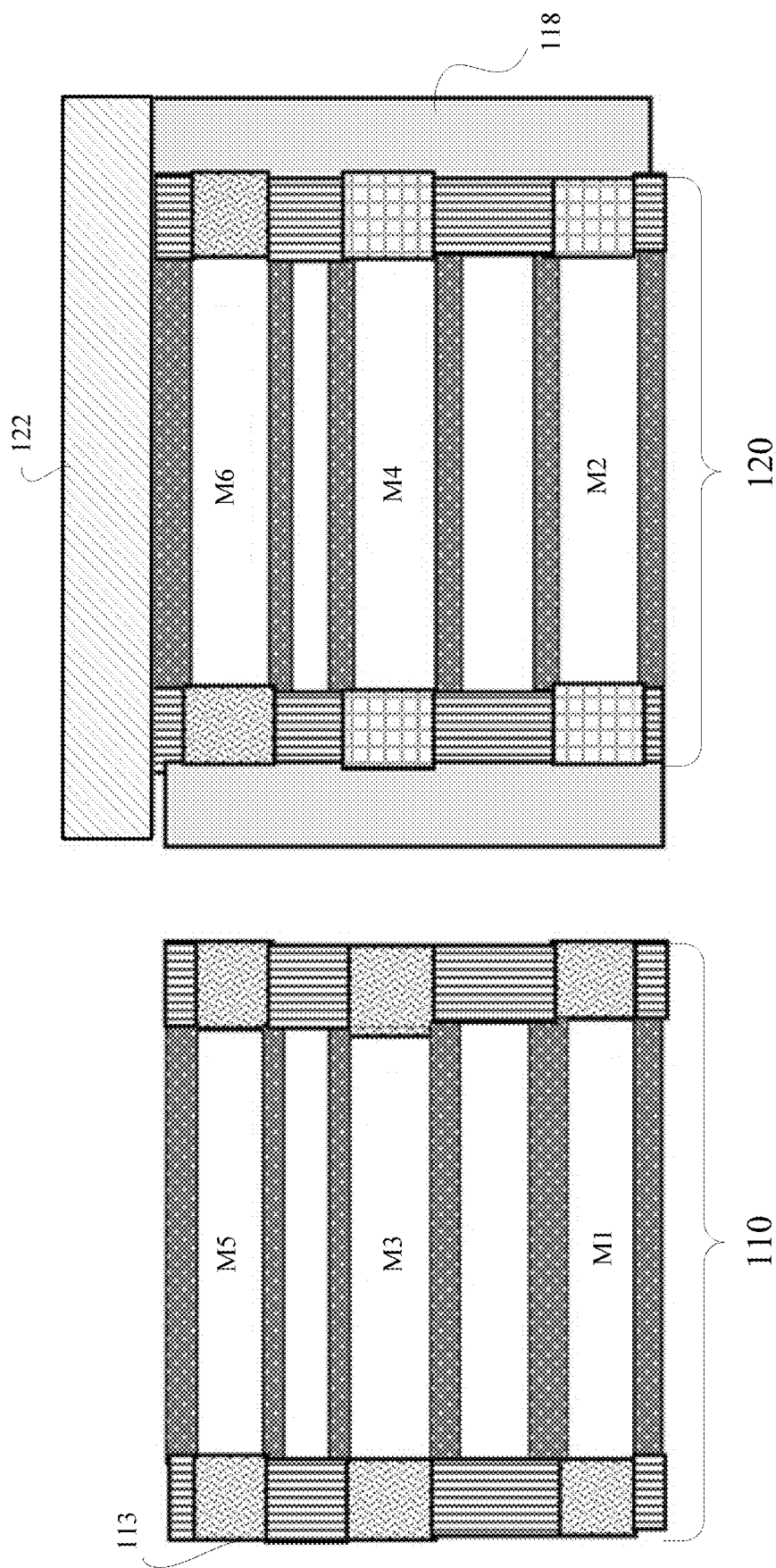
FIG. 2 shows fill material removed from the left stack.

In FIG. 2, oxide 118 covering the left stack 110 has been removed by directional etching while a photoresist etch mask 122 covers the right stack 120. The directional etching uncovers future N+ S/D regions 113 of channels M1, M3, and M5.

Figure 3:
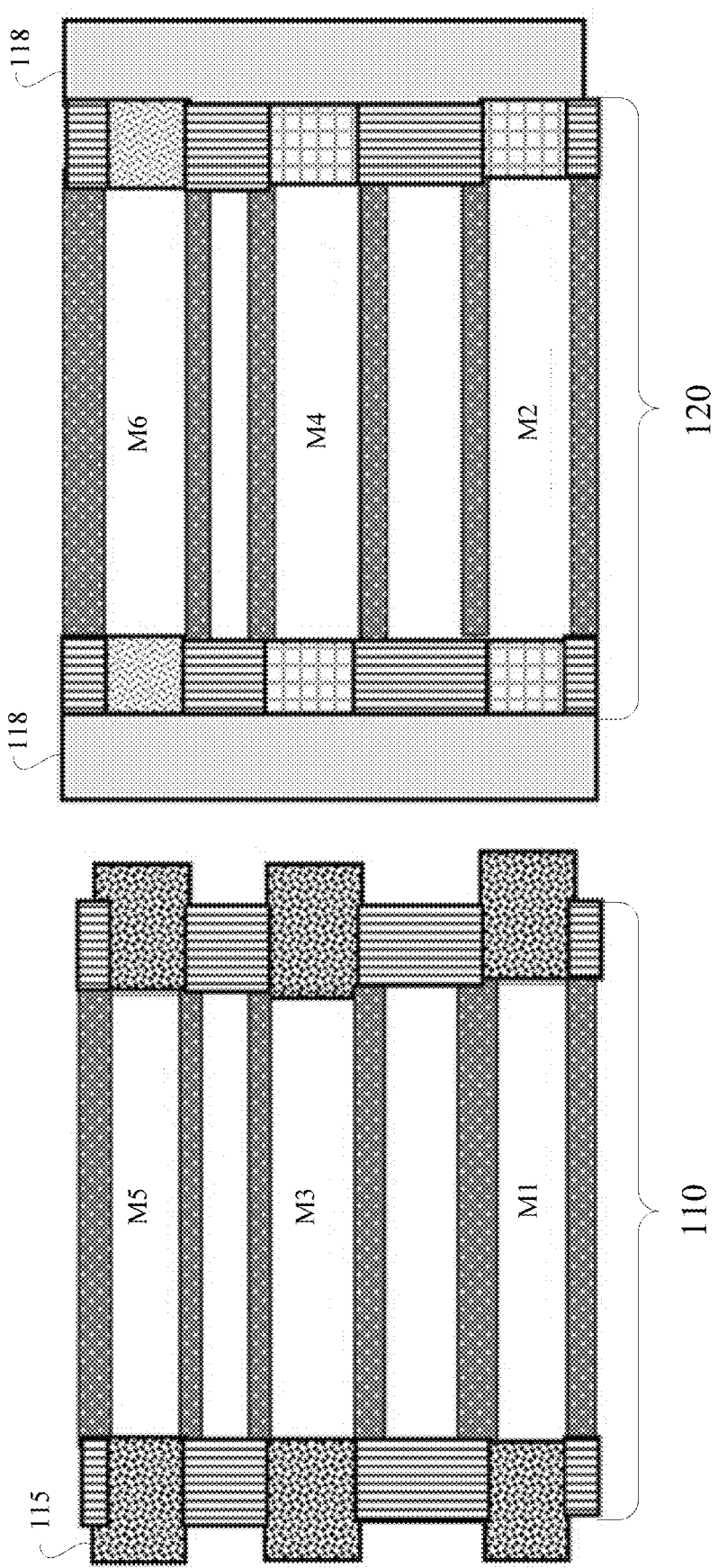
FIG. 3 shows doped S/D regions formed on the left stack.

In FIG. 3, the photoresist etch mask 122 has been removed and oxide 118 remains to cover the sides of stack 120. The oxide 118 is a nitride. This is followed by N+ epitaxial growth on the left stack 110 in each S/D region 115.

Epitaxial growth refers to a type of crystal growth or material deposition in which new crystalline layers are formed with a well-defined orientation with respect to the crystalline substrate. N+ represents silicon doped by high concentrations of dopants, such as phosphorus, arsenic or antimony. P+ represents silicon doped by high concentrations of dopants, such as boron atoms. Boron, arsenic, phosphorus, and occasionally gallium are used to dope silicon. Boron is the p-type dopant of choice for silicon integrated circuit production because it diffuses at a rate that makes junction depths easily controllable. Phosphorus is typically used for bulk-doping of silicon wafers, while arsenic is used to diffuse junctions, because it diffuses more slowly than phosphorus and is thus more controllable. A high concentration may be "degenerate", or greater than $10^{18}$ atoms/$cm^3$ at room temperature, causing the material to act like a metal. Doping concentrations for silicon semiconductors may range anywhere from $10^{13}$/$cm^3$ to $10^{18}$/$cm^3$. Degenerately doped silicon contains a proportion of impurity to silicon on the order of parts per thousand. N+ or P+ epitaxial growth of the S/D regions is performed by using vapor-phase epitaxy (VPE), a modification of chemical vapor deposition. During deposition, the epitaxial layer is doped by adding impurities to a source gas, such as arsine, phosphine or diborane depending on whether an N+ or P+ S/D region is being formed.

Figure 4:
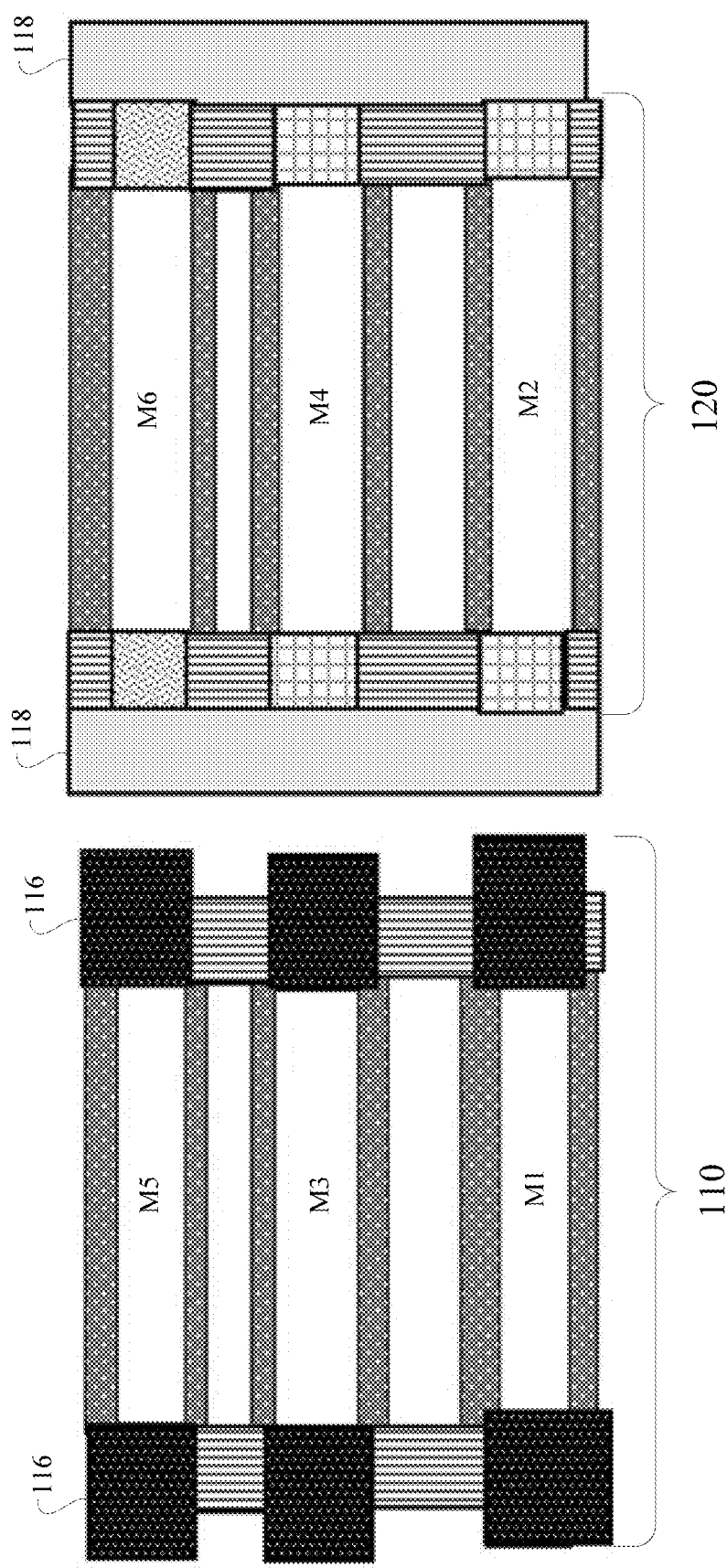
FIG. 4 illustrates the selective deposition of a protective film on the left stack.
Figure 5:
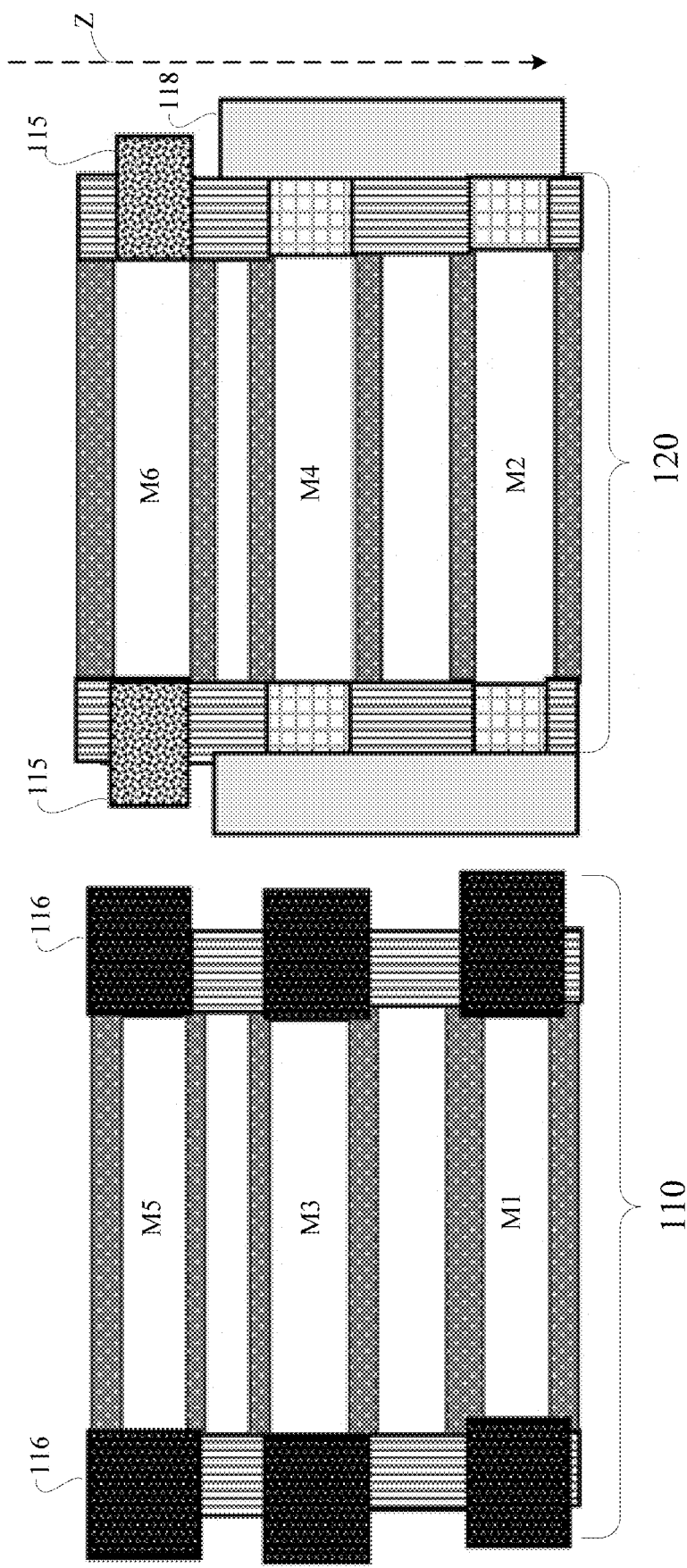
FIG. 5 shows fill material removed from the ends of a first nano-channel of the right stack and S/D formation on the ends.

As shown in FIG. 4, the newly grown N+ S/D regions 114 are then selectively covered with a protection film 116. For example, a selective high-K deposition is executed to cover up N+ regions on the left stack 110. Alternatively, a low temperature oxide growth may be executed to protect the uncovered S/D regions. The high-k layer 116 may be selected from the group comprising $HfO_2$, $Al_2O_3$, $Y_2O_3$, $ZrO_2$, $HfZrO_4$, $TiO_2$, $Sc_2O_3$, $La_2O_3$, $Lu_2O_3$, $Nb_2O_5$, $Ta_2O_5$.

Figure 6:
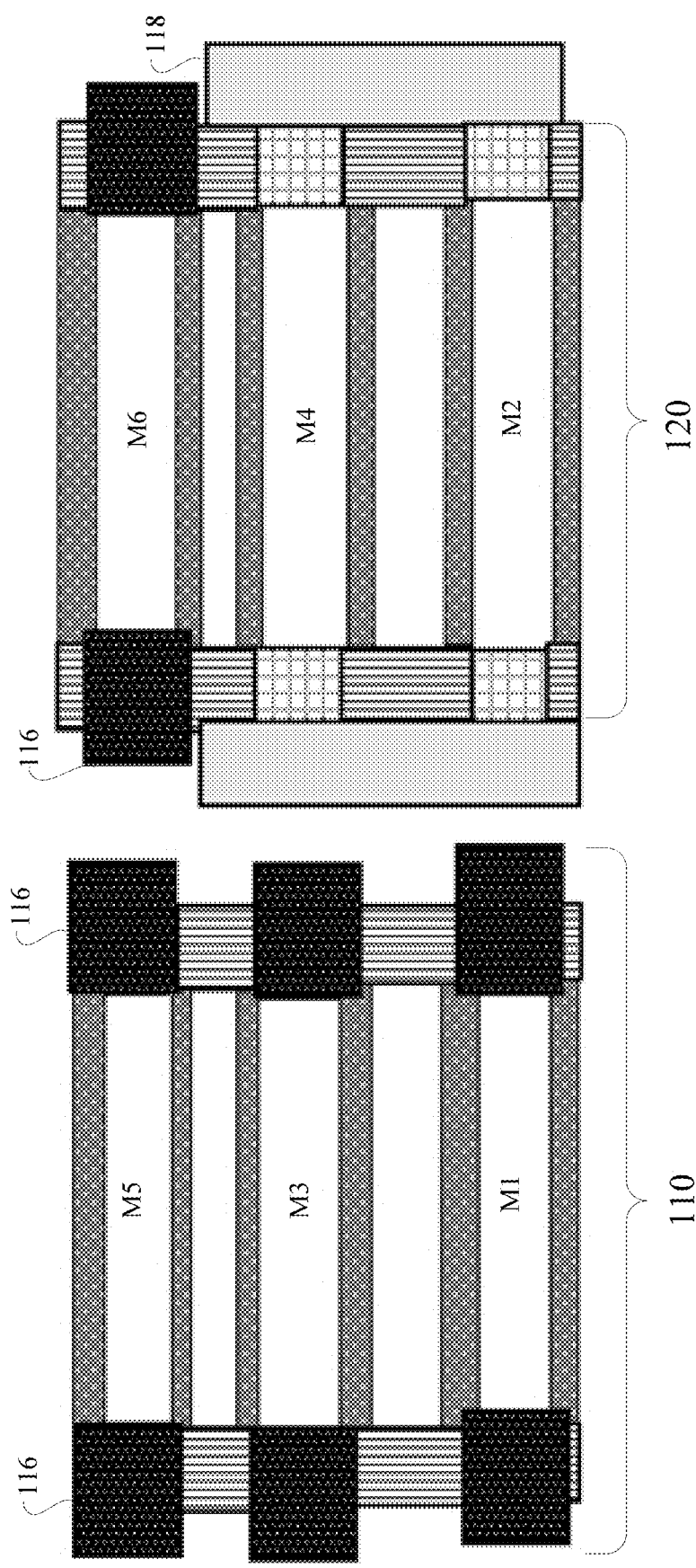
FIG. 6 shows a protective film covering S/D regions formed on the ends of the first nano-channel of the right stack of FIG. 5.

Next, from a top-down direction, a portion of the second nano-channel stack 120 is uncovered while one or more nano-channels positioned under that portion remain covered. The portion uncovered can reveal ends of one or more nano-channels. In the example in FIG. 5, channel M6 is uncovered, while channels M4 and M2 remain covered. N+ epitaxial S/D regions 115 are then grown for channel M6. This can be followed by selective deposition of a protective film 116, such as a high-K film, over the N+ S/D regions of the right stack 120 as shown in FIG. 6.

Figure 7:
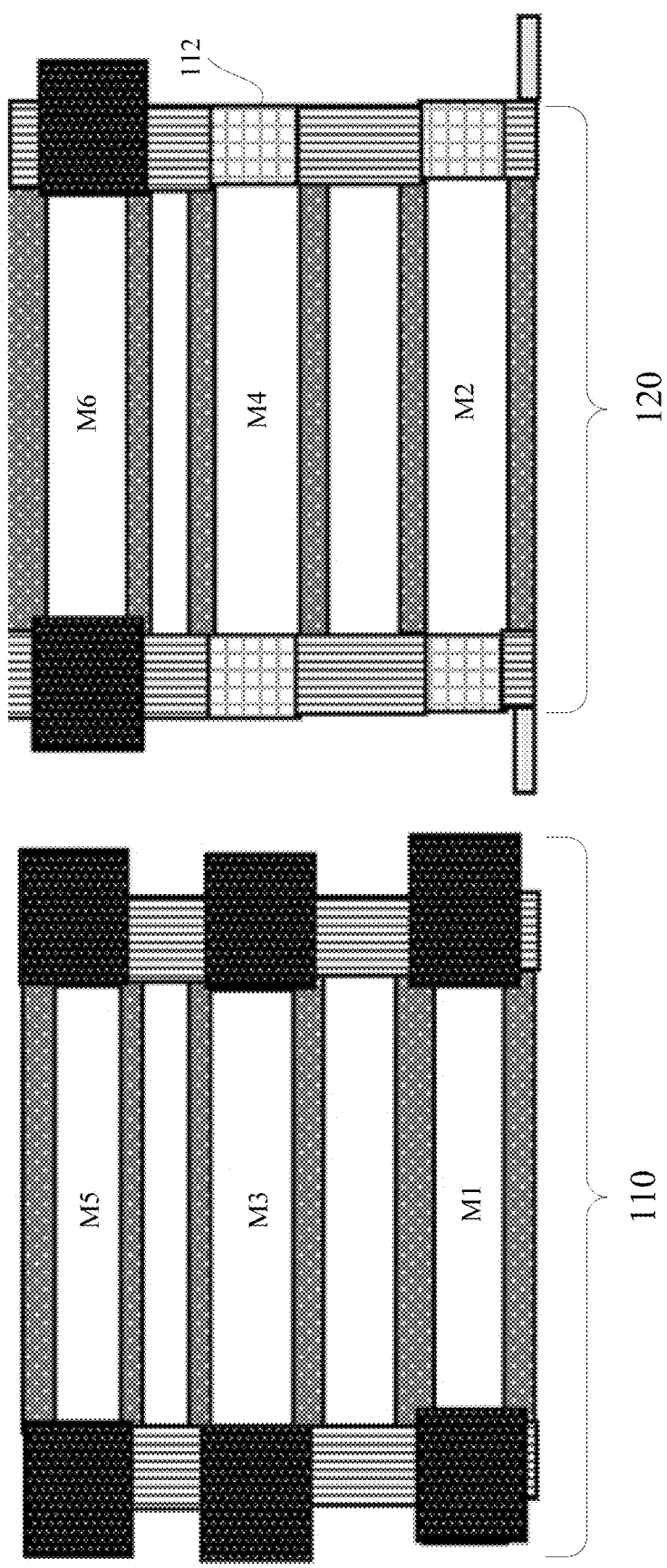
FIG. 7 shows fill material removed from the ends of the remaining nano-channels of the right stack.
Figure 8:
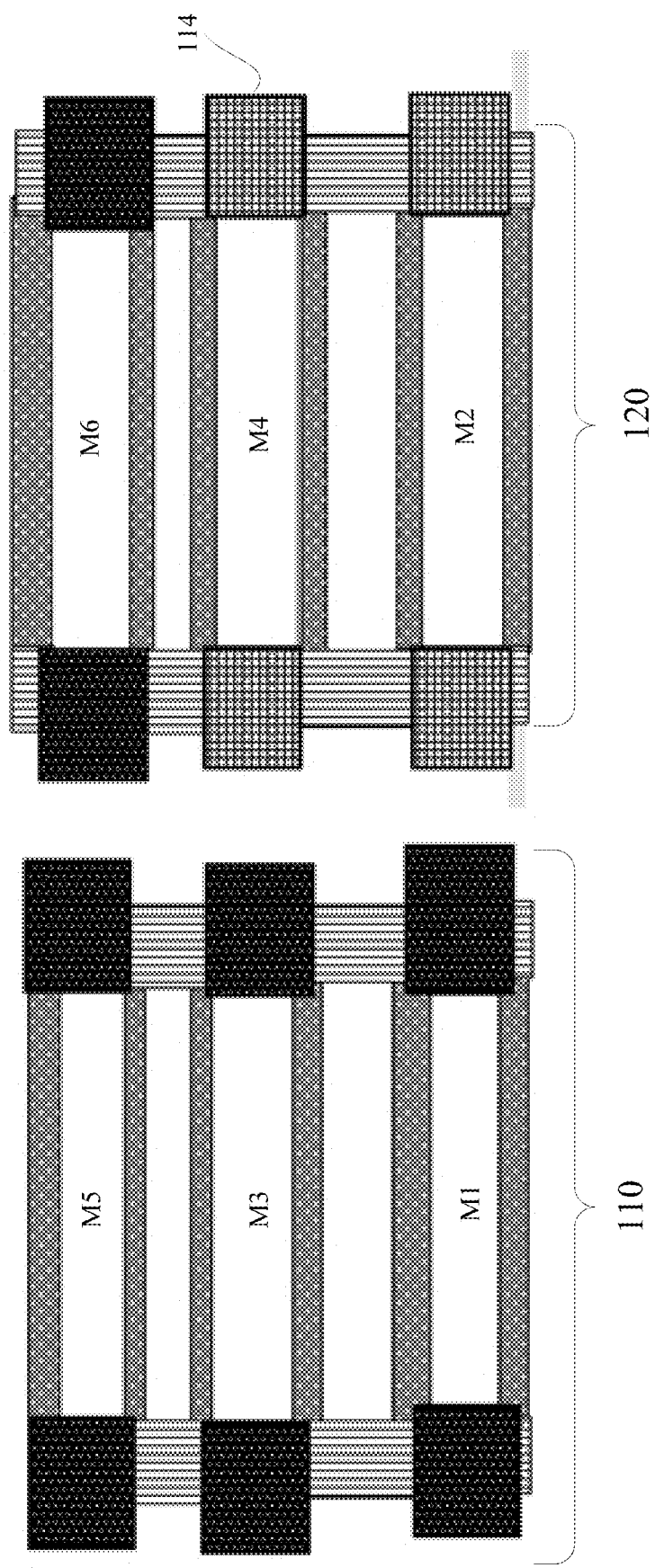
FIG. 8 shows doped S/D regions formed on the ends of the remaining nano-channels of the right stack.
Figure 9:
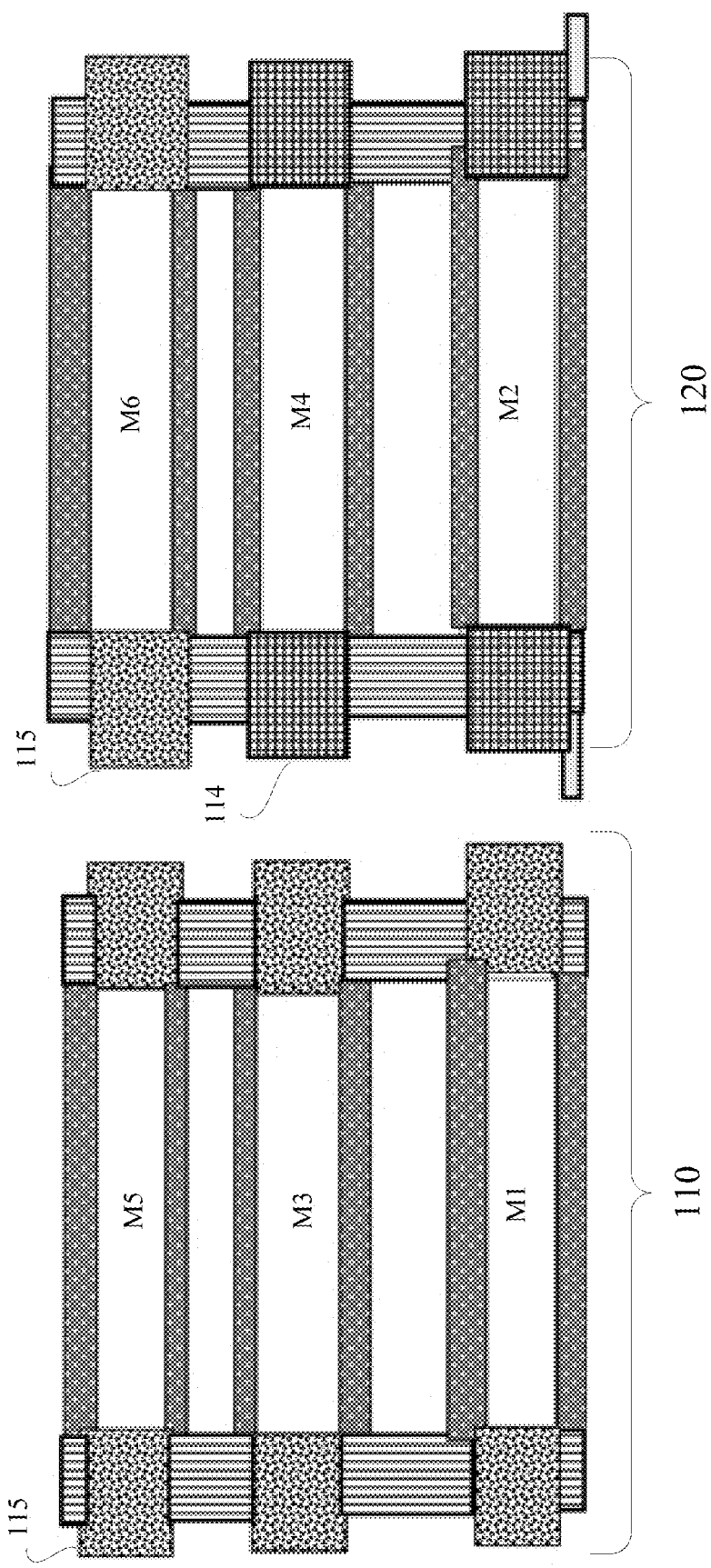
FIG. 9 shows the vertically stacked 3D cell with all protective film removed.

In FIG. 7, the remaining oxide covering the ends of the vertical stack 120 on the right is removed by reactive ion etching, which uncovers future P+ S/D regions 112. P+ epitaxial S/D regions 114 are then grown on the stack 120 on the right, as shown in FIG. 8. These are the last to be formed of S/D regions so there is no need to deposit a protective film on these P+ S/D regions. FIG. 9 shows the protective film removed from all S/D regions with both stacks completed and with each stack having different S/D formation.

In an aspect, finishing the stacks includes depositing various layers of the gate structures including a gate dielectric layer and a conductive layer, and patterning the various layers to form the gate structures. A replacement metal gate process (RMG) first forms temporary (or dummy) gate structures and then replaces the temporary gate structures with finished gate structures.

The process flow focuses on the replacement metal gate (RMG) steps to form gate oxides and work function metals. Additional steps to complete the SRAM device can include forming local interconnects, followed by additional metallization (not shown). The completion process continues with established processes to finish with TiN, TaN, TiAl depositions, replacement metal gate P-type work function metal (RMG PWFM) removal, RMG final, gate cut (CMG), and forming M0 and M1 dual damascene metal layer horizontal and vertical connections, where M0 refers to a lower metal layer of the stack and M1 refers to an upper metal layer of the stack. Vertical vias may be used to connect wiring to the M0 and M1 layers, as is known in the art.

The work function metal layer may be a p-type or an n-type work function layer depending on the type (PFET or NFET) of the device. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. A metal fill layer may include aluminum (Al), tungsten (W), cobalt (Co), and/or other suitable materials.

In the dual damascene process, the structure undergoes a diffusion barrier etch step, after which a via dielectric is deposited. An etch step then forms a gap in which the lines and vias are formed.

A thin layer of barrier of tantalum (Ta) and tantalum nitride (TaN) materials are deposited using physical vapor deposition (PVD). Ta is used to form the liner and TaN is for the barrier in a structure. The barrier layer is coated over by a copper seed barrier via physical vapor deposition (PVD). And finally, the structure is electroplated with copper and polished planar using chemical mechanical polishing (CMP).

Figure 10A:
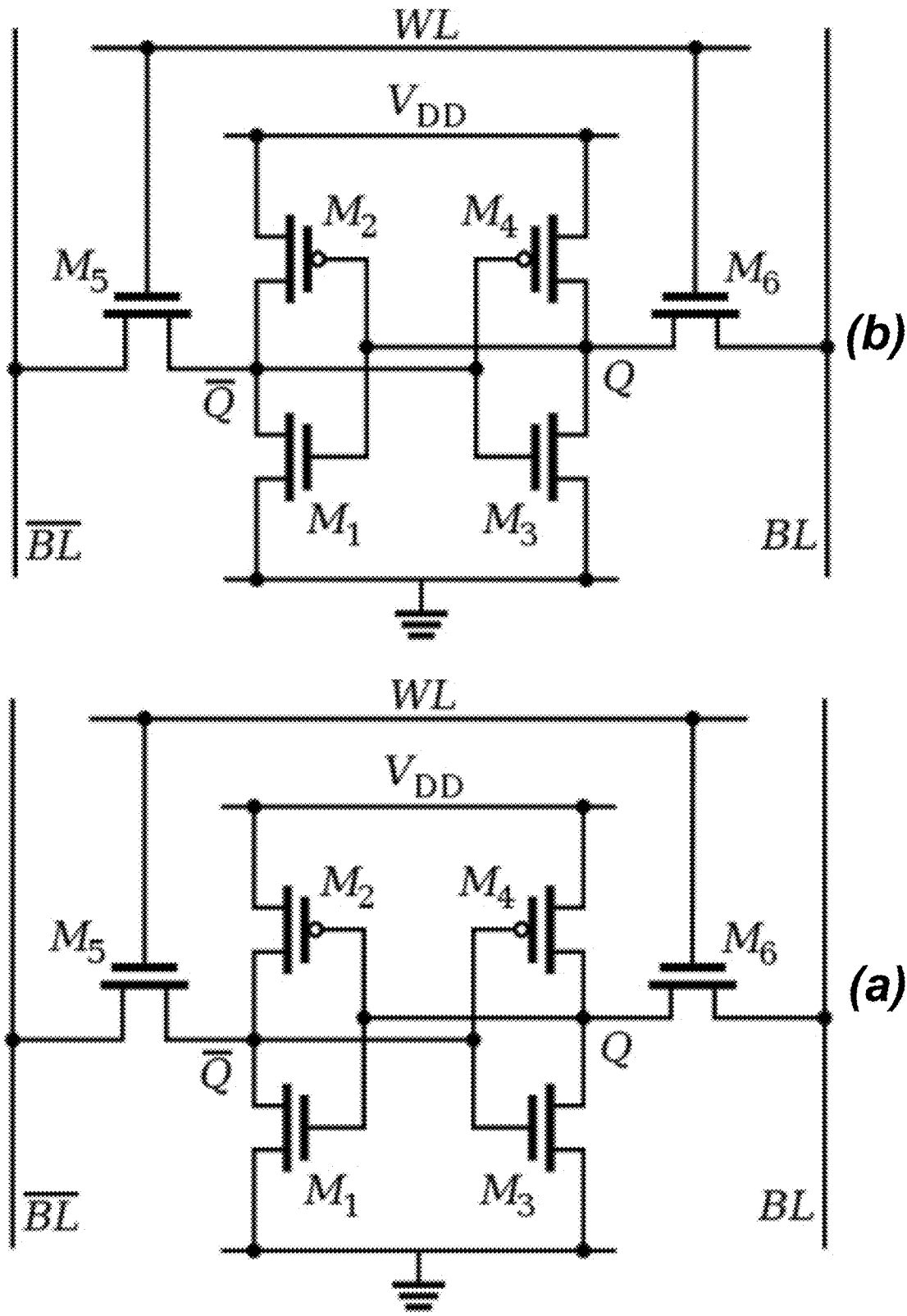
FIG. 10A depicts the circuit diagram of a dual SRAM cell.
Figure 10B:
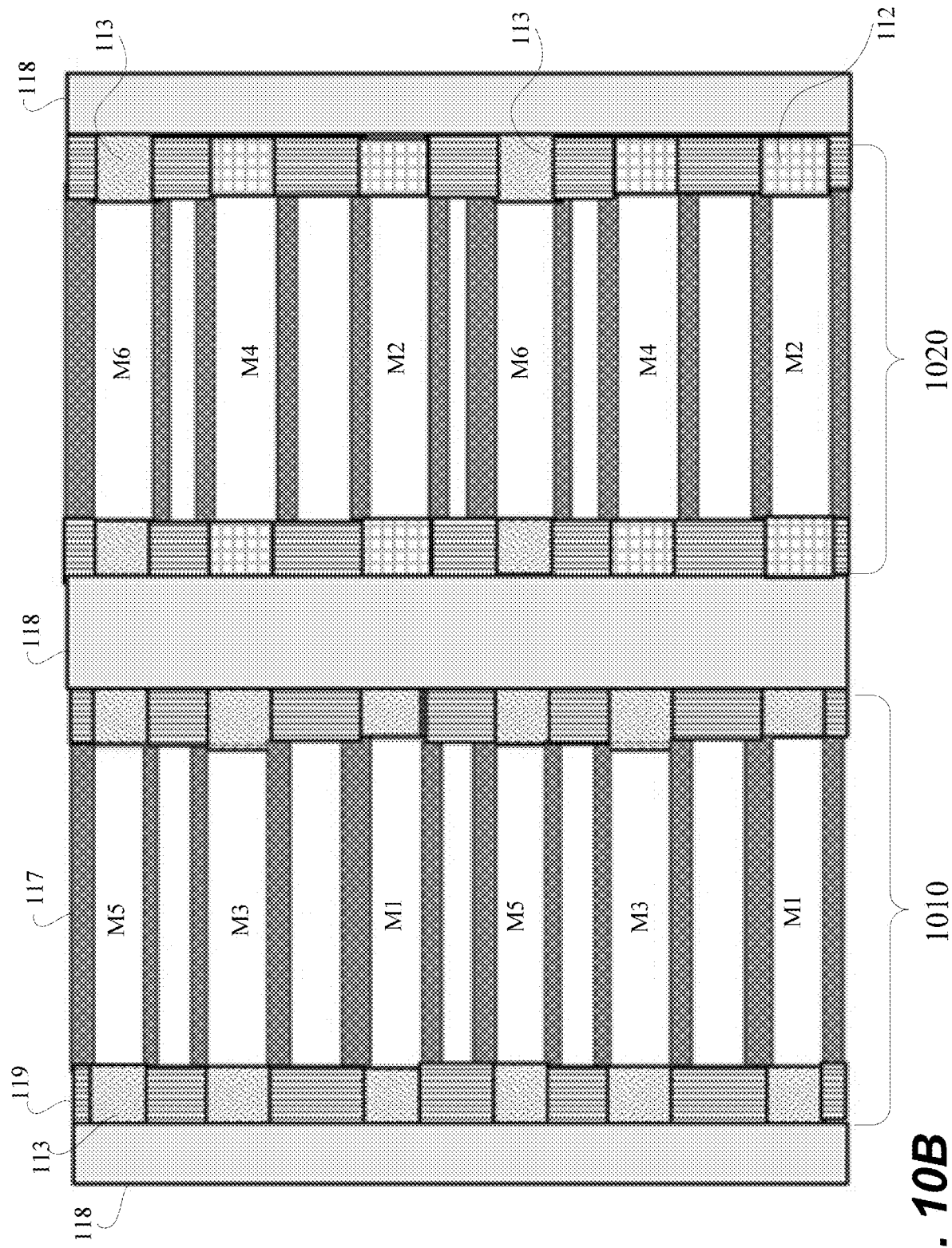
FIG. 10B illustrates dual stacks of 3D SRAM cells separated by fill material.

Example 2 of a six-layer stack with different S/D combinations for use with a dual SRAM 3D stack of 12 transistors and a 6 transistor plane of inverters is shown in FIG. 10A, 10B, 11-21. FIG. 10A shows two SRAM circuits (1010, 1020) which will be fabricated in a single stacked device. Similar to FIG. 1C, FIG. 10B shows the dual SRAM stack having vertical nano-channel stacks formed on a substrate. Oxide 118 fills spaces between nano-channel stacks. Note that the stack on the left has all future N+ S/D regions 113 while the stack on the right has both N+ 115 and P+ S/D future regions 114. In a first process step, nano-channels (M1-M6) are formed followed by oxide deposition and polish. The nano-channels (M1-M6) of FIG. 10B represent the channels of transistors ($M_1$-$M_6$) of each of the SRAM devices of FIG. 10A (see first SRAM (a) and second SRAM (b) each having transistors $M_1$-$M_6$). On either end of a nano-channel is a source or a drain region. In FIG. 10B, 113 is an area of stack 110 in which a future N+ source or drain region will be formed. Correspondingly, 112 is an area of stack 120 in which a future P+ S/D region will be formed.

Figure 11:
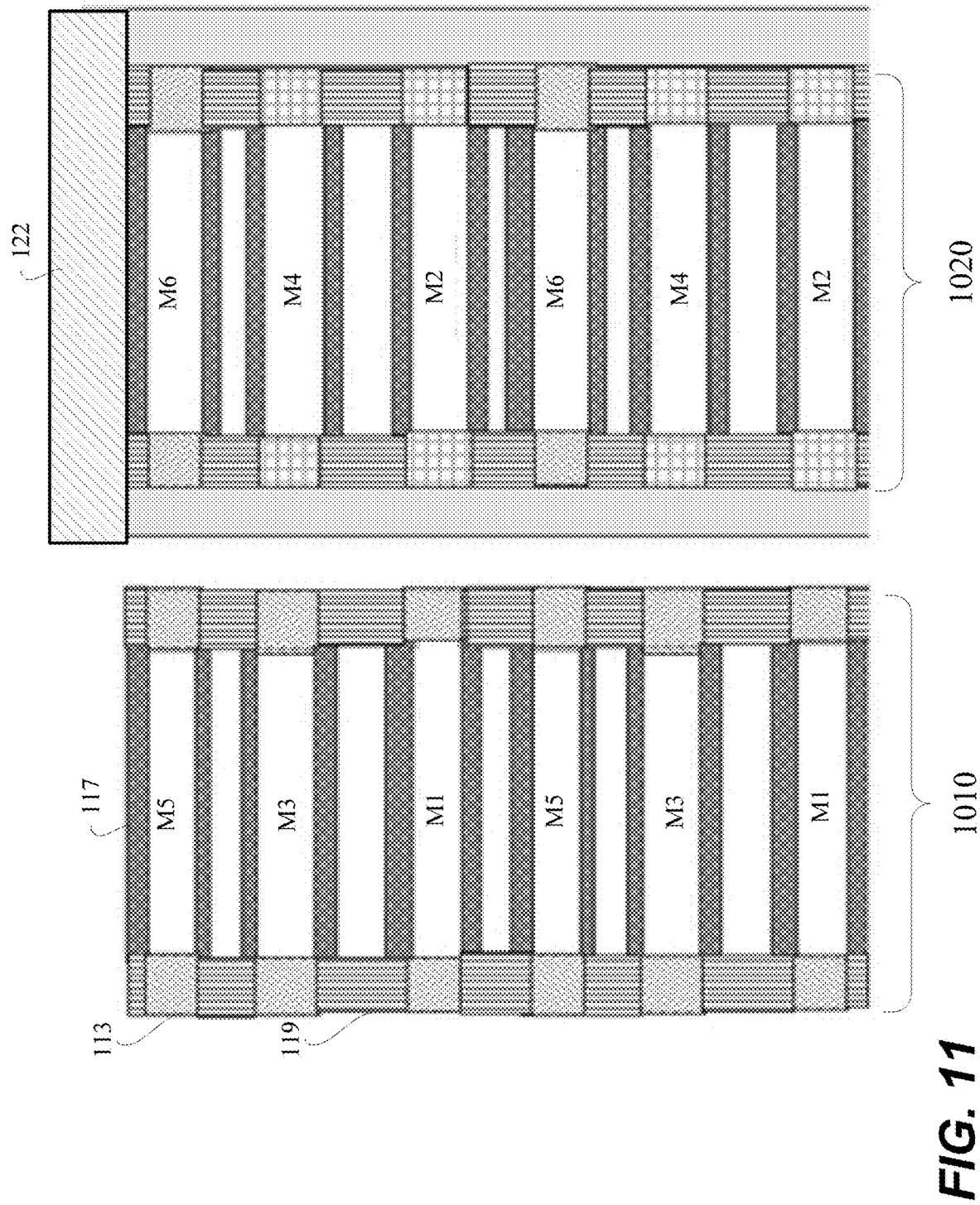
FIG. 11 illustrates the left stack of FIG. 10B with the fill material removed.
Figure 12:
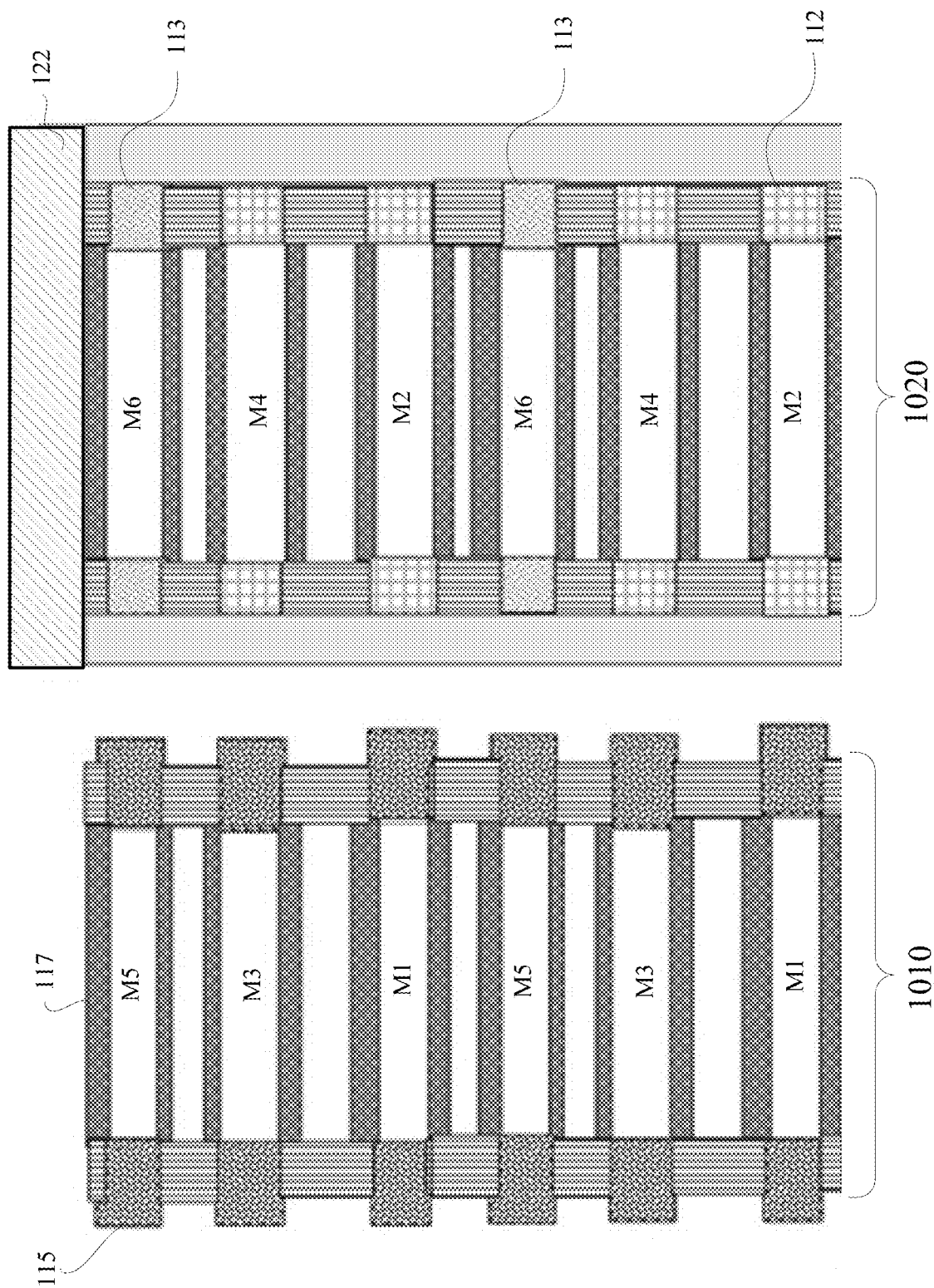
FIG. 12 shows doped S/D regions formed on the ends of the nano-channels of the left stack of FIG. 10B.
Figure 13:
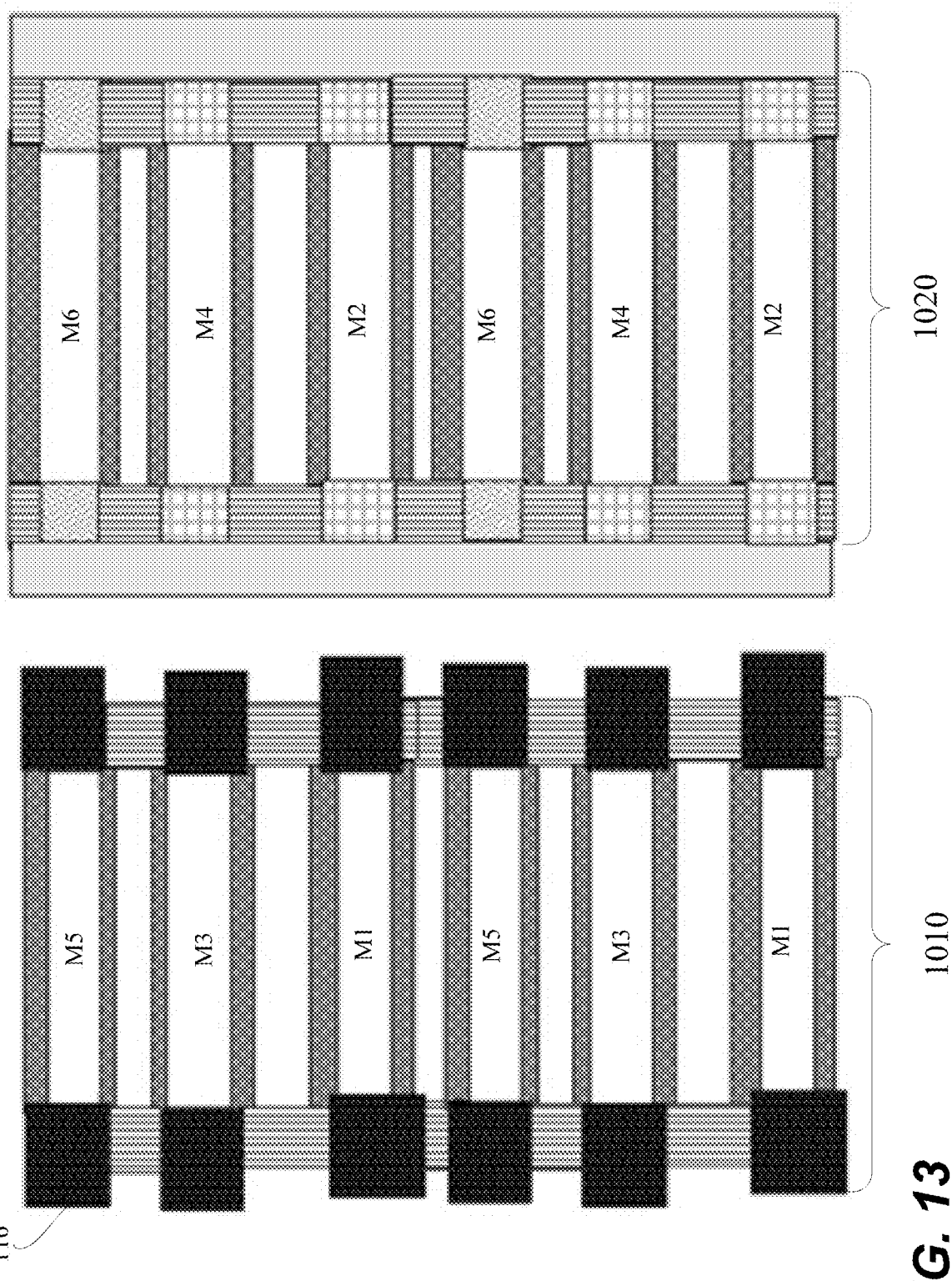
FIG. 13 shows a protective film covering N+ S/D regions formed on the left stack of FIG. 11.

FIG. 11 shows masking with photoresist 122 of the stack 1020 on the right while the stack 1010 on the left is opened up to uncover channel ends. All channel ends on the stack 1010 on the left are future N+ S/D regions 113, so these S/D regions can be grown for the entire stack at one time as shown in FIG. 12. These newly grown N+ S/D regions 115 can then be covered with a protective film 116, such as a selective high-K deposition as shown in FIG. 13.

Figure 14:
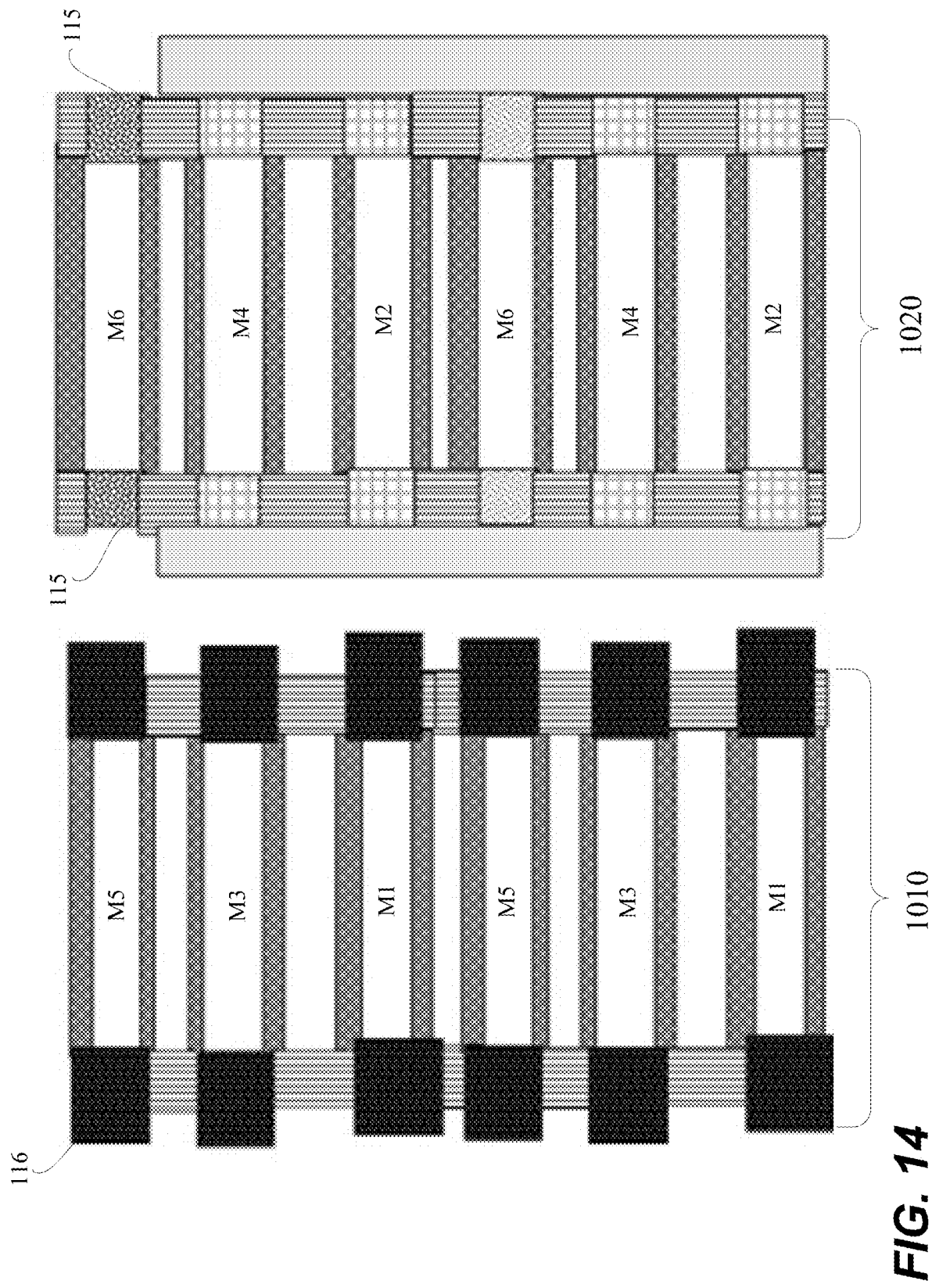
FIG. 14 shows fill material removed from the opposing ends of a first nano-channel on the right stack of FIG. 10B.
Figure 15:
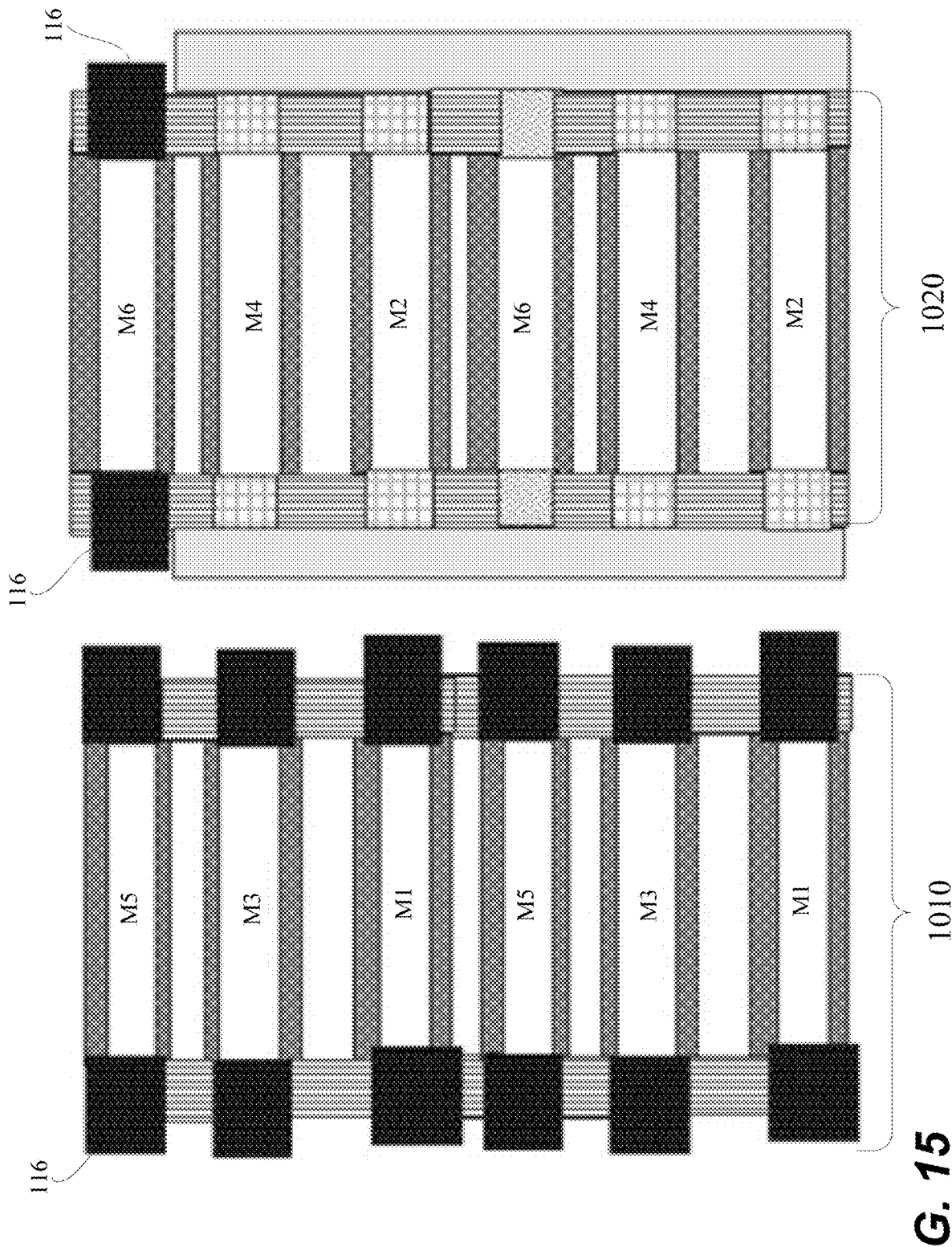
FIG. 15 shows a protective film covering N+ S/D regions formed on the uncovered opposing ends of FIG. 14.

In FIG. 14, nano-channel ends of a top channel in the stack 1020 on the right are uncovered. An N+ S/D region 115 is grown on this upper nano-channel and then covered with a protective film 116 as shown in FIG. 15.

Figure 16:
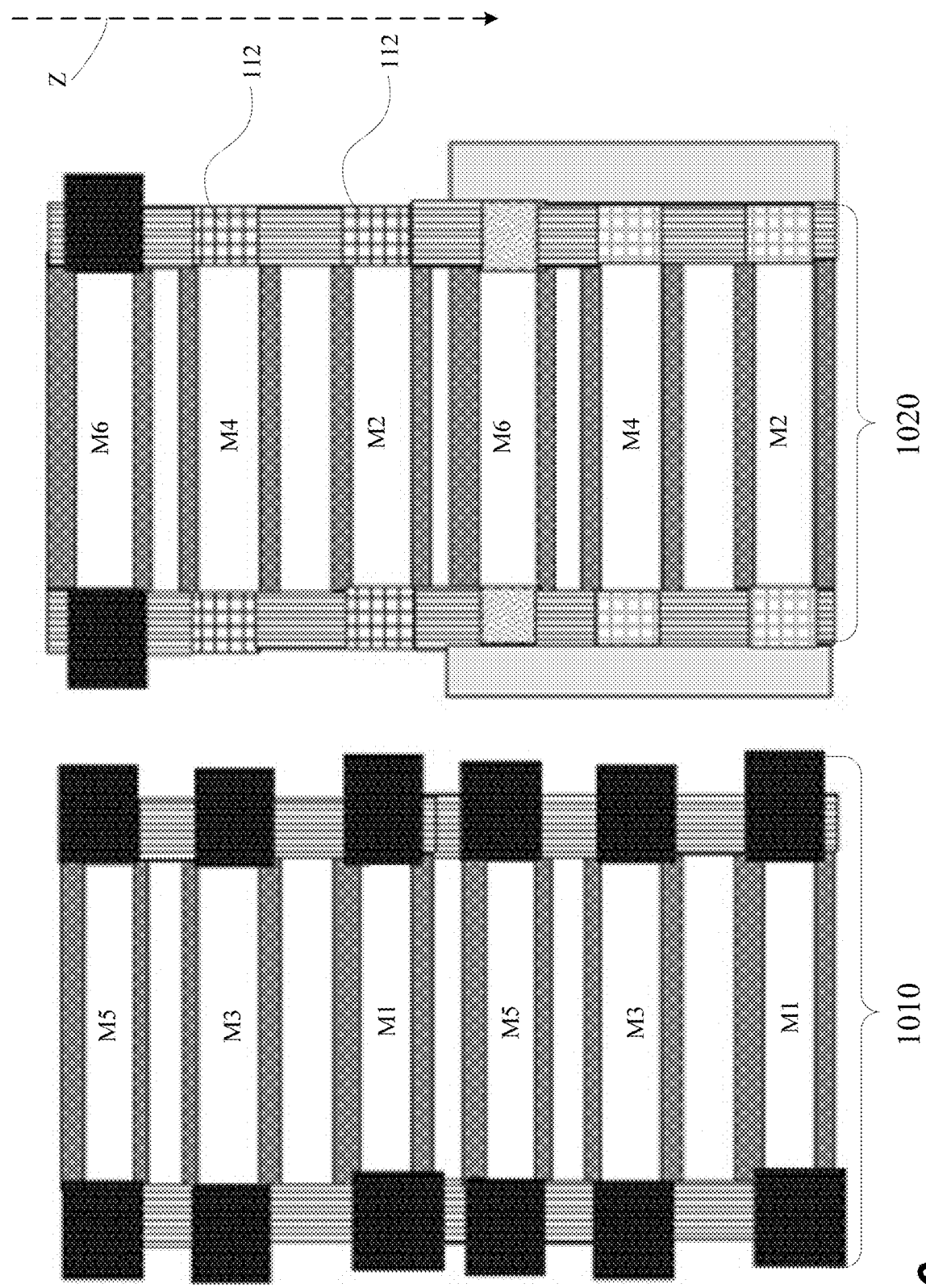
FIG. 16 shows fill material removed from the opposing ends of two nano-channels directly beneath the first nano-channel of FIG. 15.

In FIG. 16, directional etching (reactive ion etching) continues and uncovers the next two future nano-channel future P+ S/D end pairs 112 of stack 1020.

Figure 17:
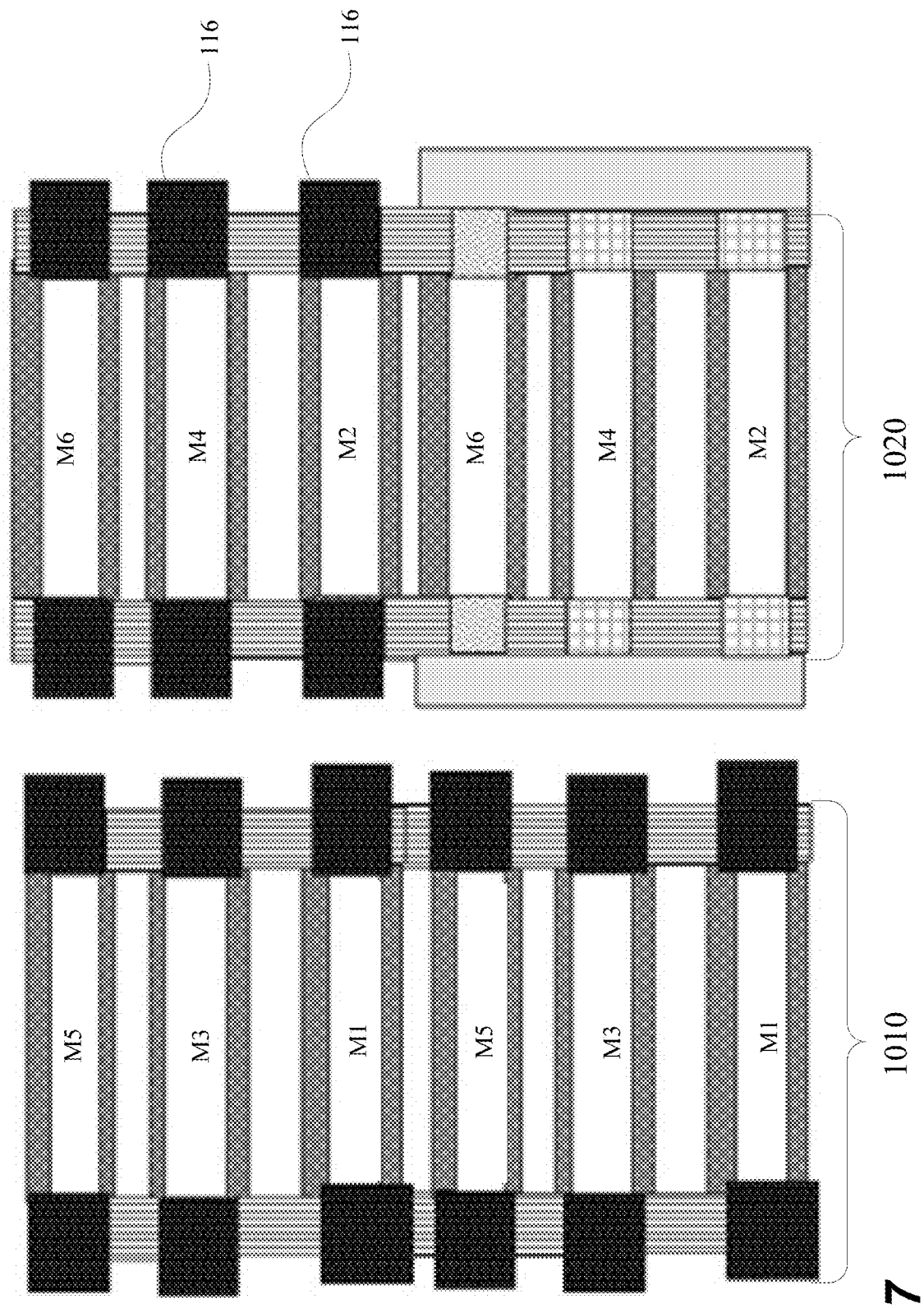
FIG. 17 shows a protective film covering N+ S/D regions formed on the uncovered opposing ends of FIG. 16.

In FIG. 17, P+ S/D regions 114 are epitaxially grown on these channel ends and then covered with a protective film 116.

Figure 18:
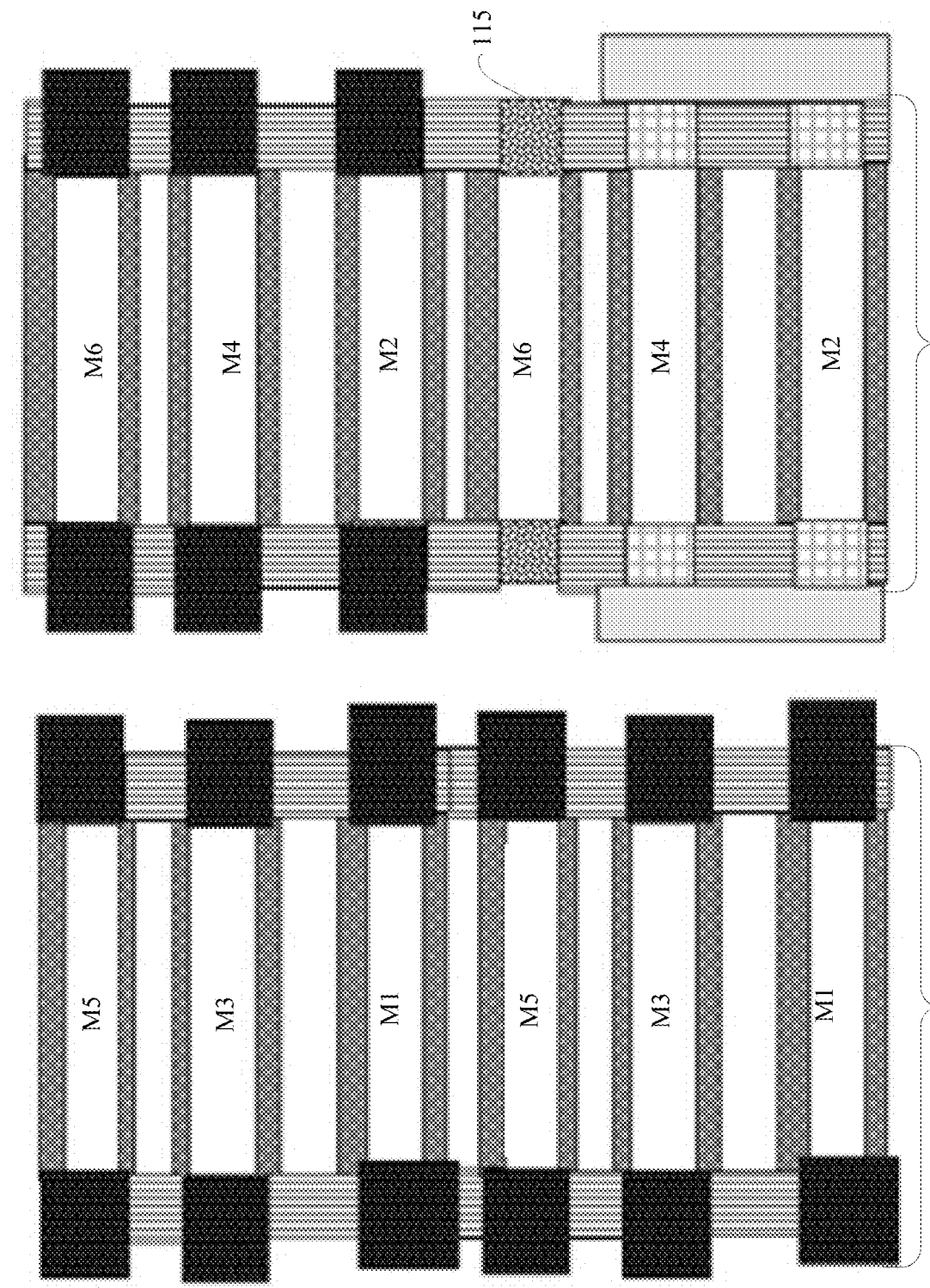
FIG. 18 shows fill material removed from the opposing ends of the nano-channel directly beneath the two nano-channels of FIG. 17.
Figure 19:
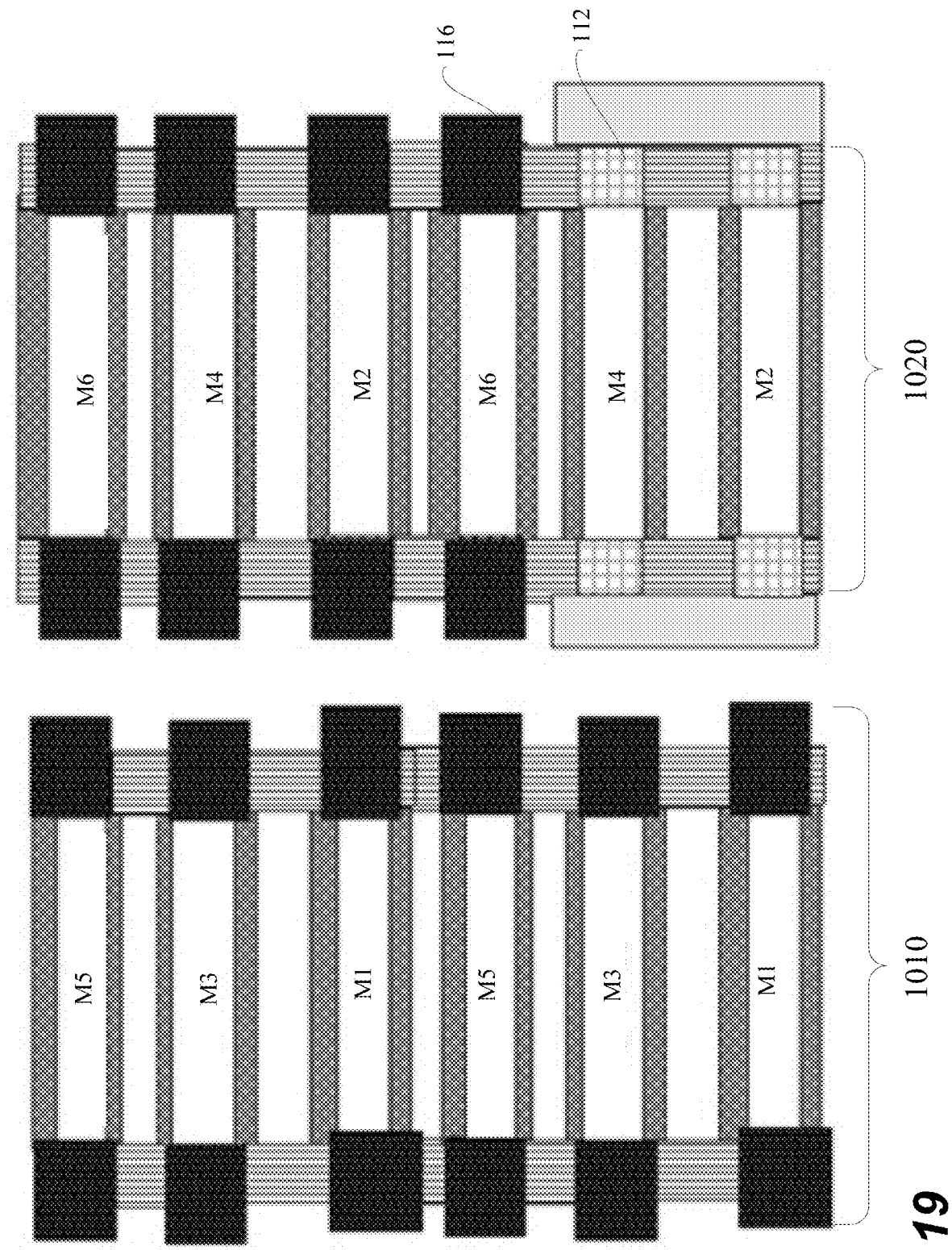
FIG. 19 shows a protective film covering N+ S/D regions formed on the uncovered opposing ends of the nano-channels of FIG. 18.

In FIG. 18, a next channel (M6 of stack 1020 corresponding the transistor M6 of the (b) SRAM of FIG. 10A) is uncovered and then N+ S/D regions 115 are epitaxially grown. In FIG. 19, these regions 115 are covered with protective oxide or high-K material.

Figure 20:
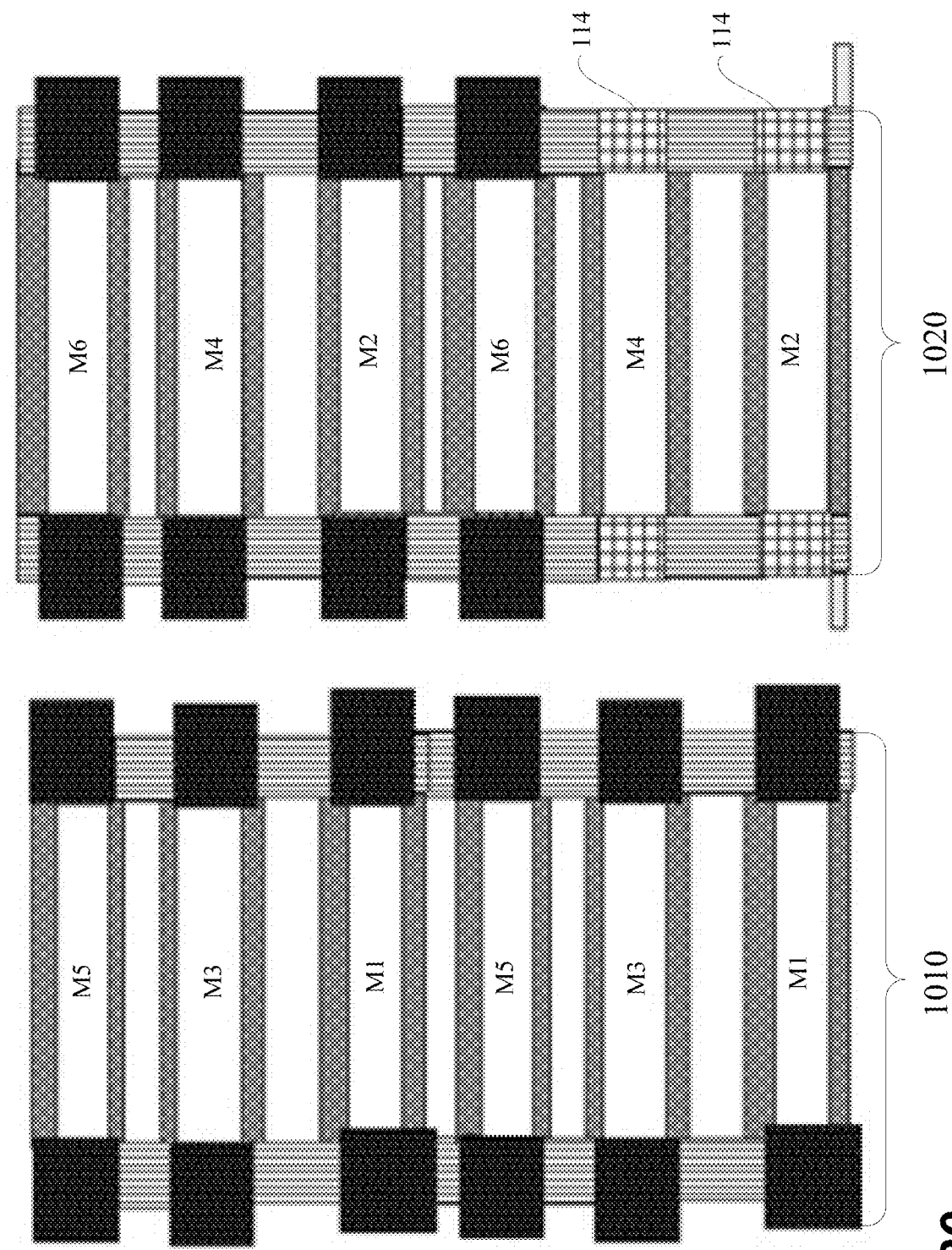
FIG. 20 shows fill material removed from the opposing ends of two nano-channels directly beneath the nano-channel of FIG. 19.
Figure 21:
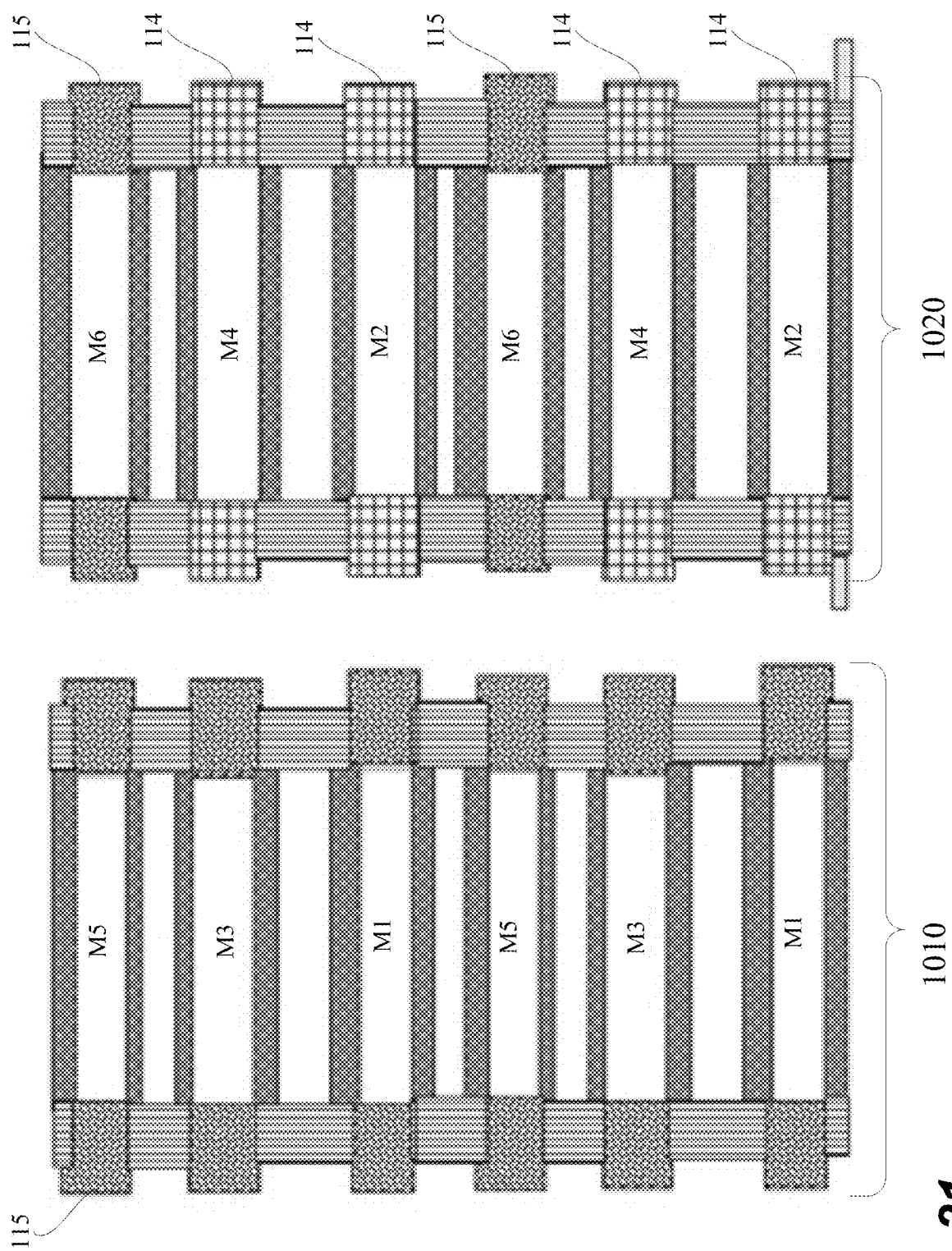
FIG. 21 shows P+ S/D formed on the opposing ends of the two nano-channels of FIG. 20 with all protective film removed from the dual stacks of 3D SRAM cells.

In FIG. 20, the remaining channels (M2 and M4 corresponding the transistor M6 of the (b) SRAM of FIG. 10A) in the stack 1020 on the right are uncovered revealing future P+ S/D regions 112 (see FIG. 19) and P+ S/D regions 114 are epitaxially grown. Then all protective films can be removed. The resulting stack pair is shown in FIG. 21. Note that two complete SRAM cells 1010 and 1020 stacked vertically are formed. As can be appreciated, techniques herein can be modified to form any combination of S/D types on each plane of vertical stacks of GAA devices.

At this point, the process flow is focuses on replacement metal gate (RMG) steps to form gate oxides and work function metals. Additional steps to complete the dual SRAM 3D can include forming local interconnects (Li), followed by additional metallization (not shown). The completion process continues with established processes to finish with TiN, TaN, TiAl depositions, replacement metal gate P-type work function metal (RMG PWFM) removal, RMG final, gate cut, and forming M0 and M1 dual damascene metal layer horizontal and vertical connections.

Figure 22A:
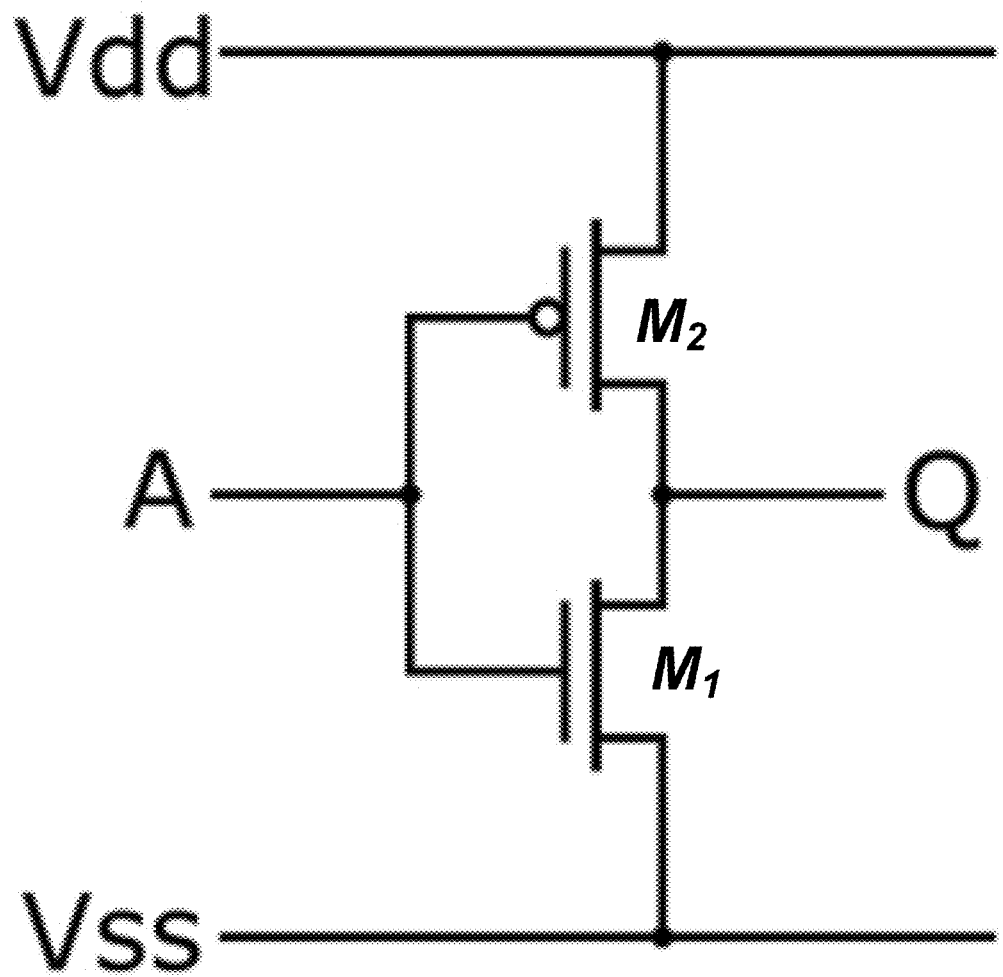
FIG. 22A depicts the circuit diagram for a 3D stacked six tier inverter.

FIG. 22A is a circuit diagram of a single CMOS inverter circuit. $M_1$ and $M_2$ are series connected transistors. "A" is the gate control signal and Q is the output. $V_{dd}$ and $V_{ss}$ are power rails. Multiple inverter circuits can be stacked on a single substrate using the techniques of the present disclosure.

Example 3 of a manufacturing process for stacked CMOS inverters is shown in FIG. 22B to FIG. 27. FIG. 22B to FIG. 27 use similar techniques to those previously described. In Example 3, six inverter planes with N+ S/D and P+ S/D are grown together in one stack. In general, the stack on the left is uncovered and N+ S/D regions are grown on each nano-channel, then protected. Subsequently, the stack on the right is uncovered, and P+ S/D regions are grown on all channel ends of the stack on the right, forming the stacks of a 3D CMOS inverter.

Figure 22B:
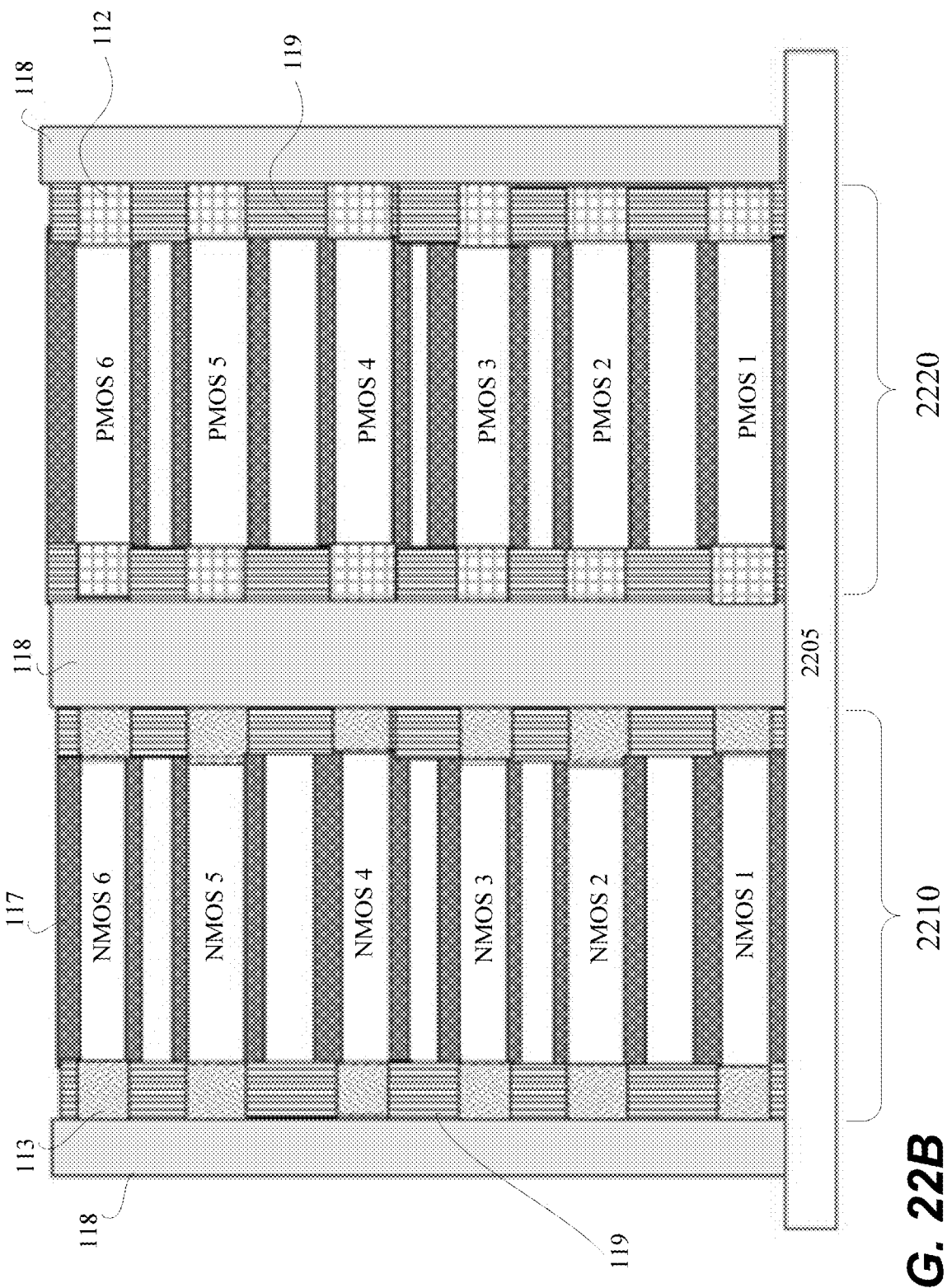
FIG. 22B illustrates the 3D vertical stacking of a plurality of NMOS and PMOS nano-channels covered with fill material before S/D formation.

In FIG. 22B, cross-sectional substrate segments illustrate the process flow of forming a vertically stacked 3D CMOS inverter. FIG. 22B shows a cross-section of an CMOS inverter fabricated on a substrate 2205 and having stacks (2210, 2220) of nano-channels connected to S/D regions which form the NMOS transistors $M_1$ and PMOS transistors $M_2$ of FIG. 22A. In a first process step, nano-channels are formed, followed by oxide deposition and polish. The nano-channels of FIG. 22B represent the six channels of six stacked NMOS transistors $M_1$ and the six channels of six stacked PMOS transistors $M_2$ of FIG. 22A. On either end of a nano-channel is a source or a drain of each respective transistor. In FIG. 22B, 113 is an area of stack 2210 in which a future N+ source or drain region will be formed. Correspondingly, 112 is an area of stack 2220 in which a future P+ S/D region will be formed. Oxide fill surrounds the structure and separates the stacks 2210 and 2220. A spacer 119 is formed between each transistor to suspend the channels.

Figure 23:
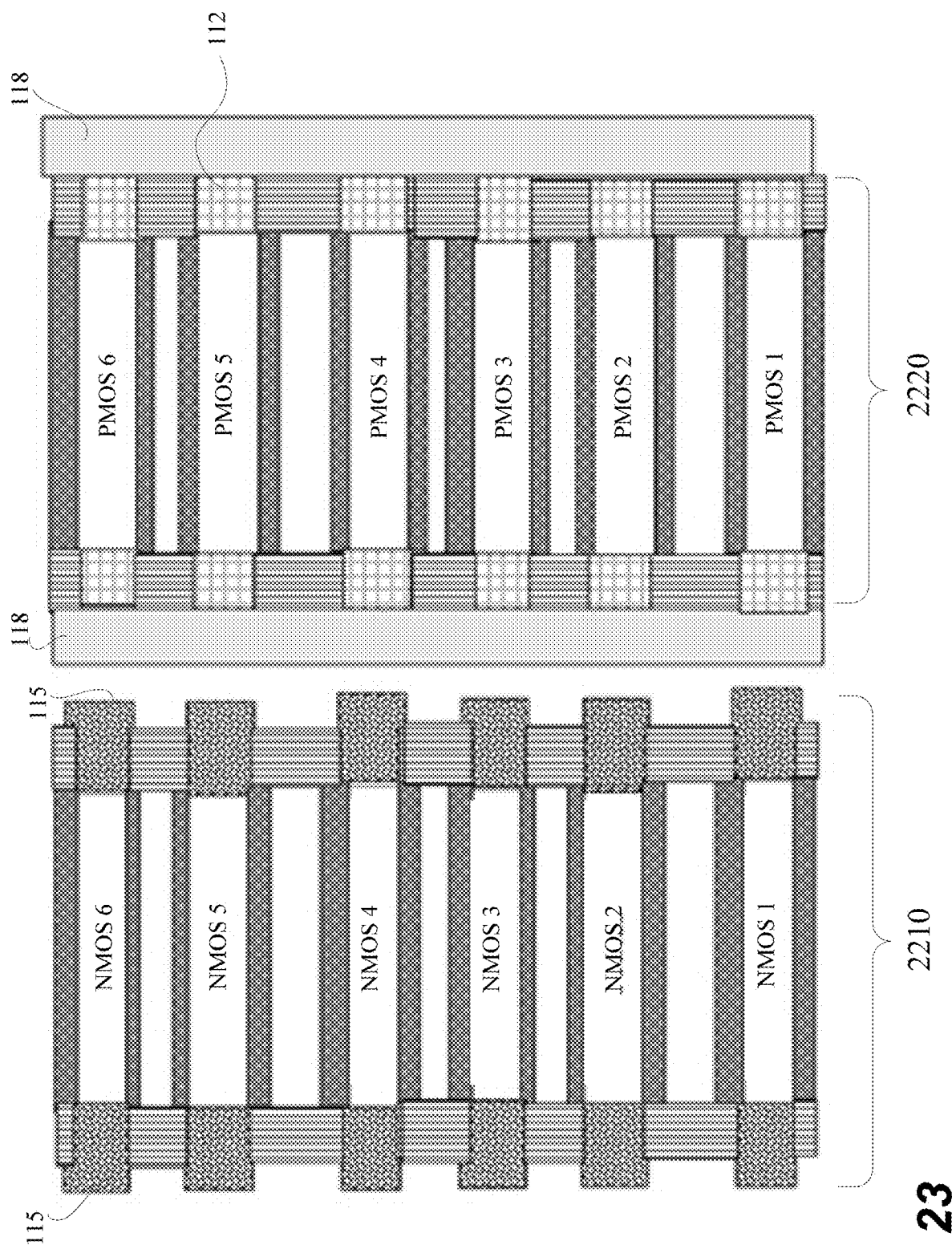
FIG. 23 shows fill material removed from the opposing ends of the NMOS nano-channels.

In FIG. 23, oxide fill 118 has been etched from stack 2210 and N+ S/D regions 115 have been grown epitaxially. Stack 2220 retains the oxide fill 118 which protects its future P+ S/D regions 112. It may be noted that the S/D regions are grown in one step.

Figure 24:
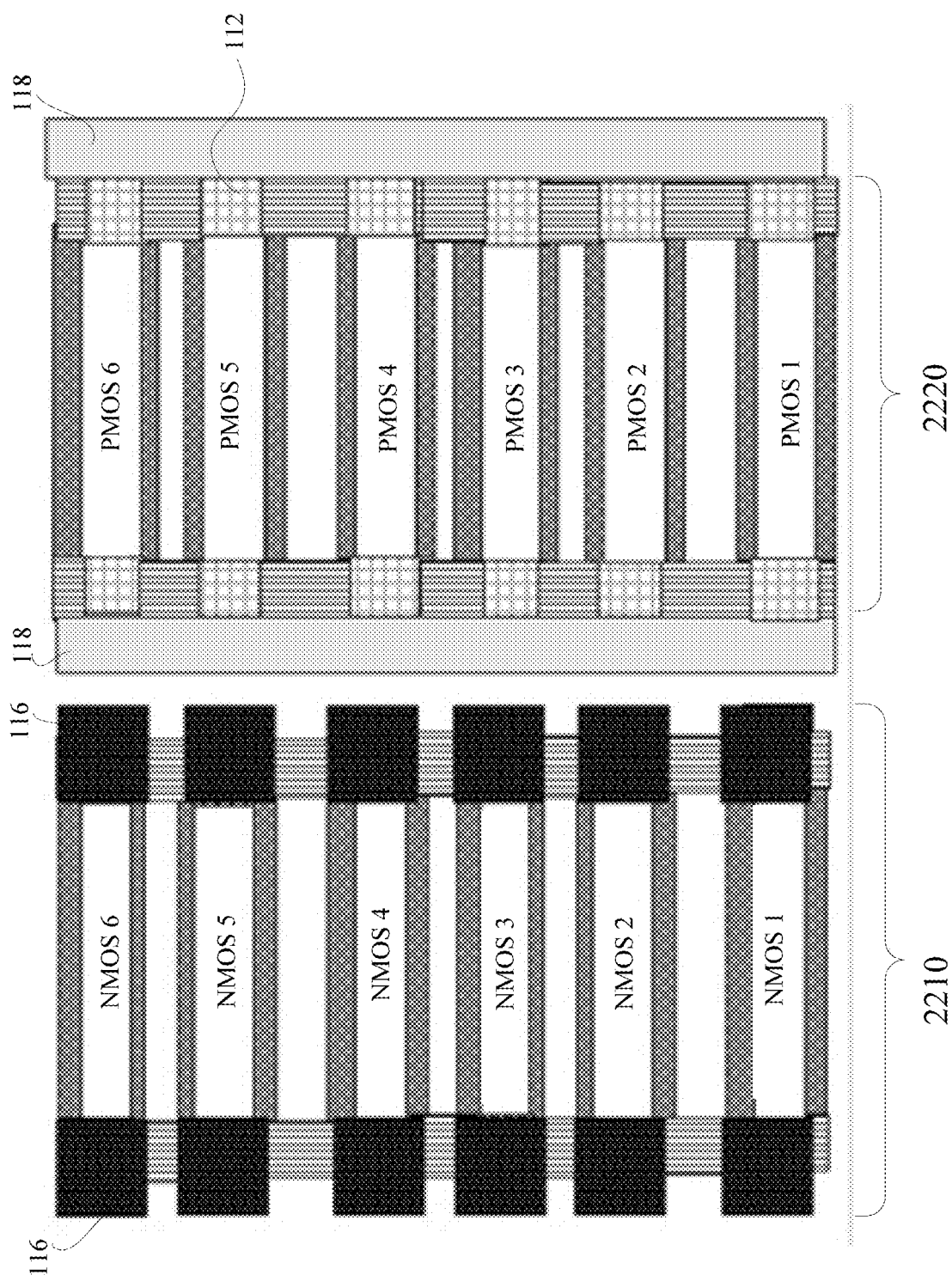
FIG. 24 shows a protective film covering N+ S/D regions formed on the uncovered opposing ends of the NMOS nano-channels of FIG. 23.

In FIG. 24, the newly grown N+ S/D regions 115 of stack 2210 are covered by a high-K or a low temperature oxide 116 in preparation for the formation of P+ S/D regions on the ends of the channels of stack 2220.

Figure 25:
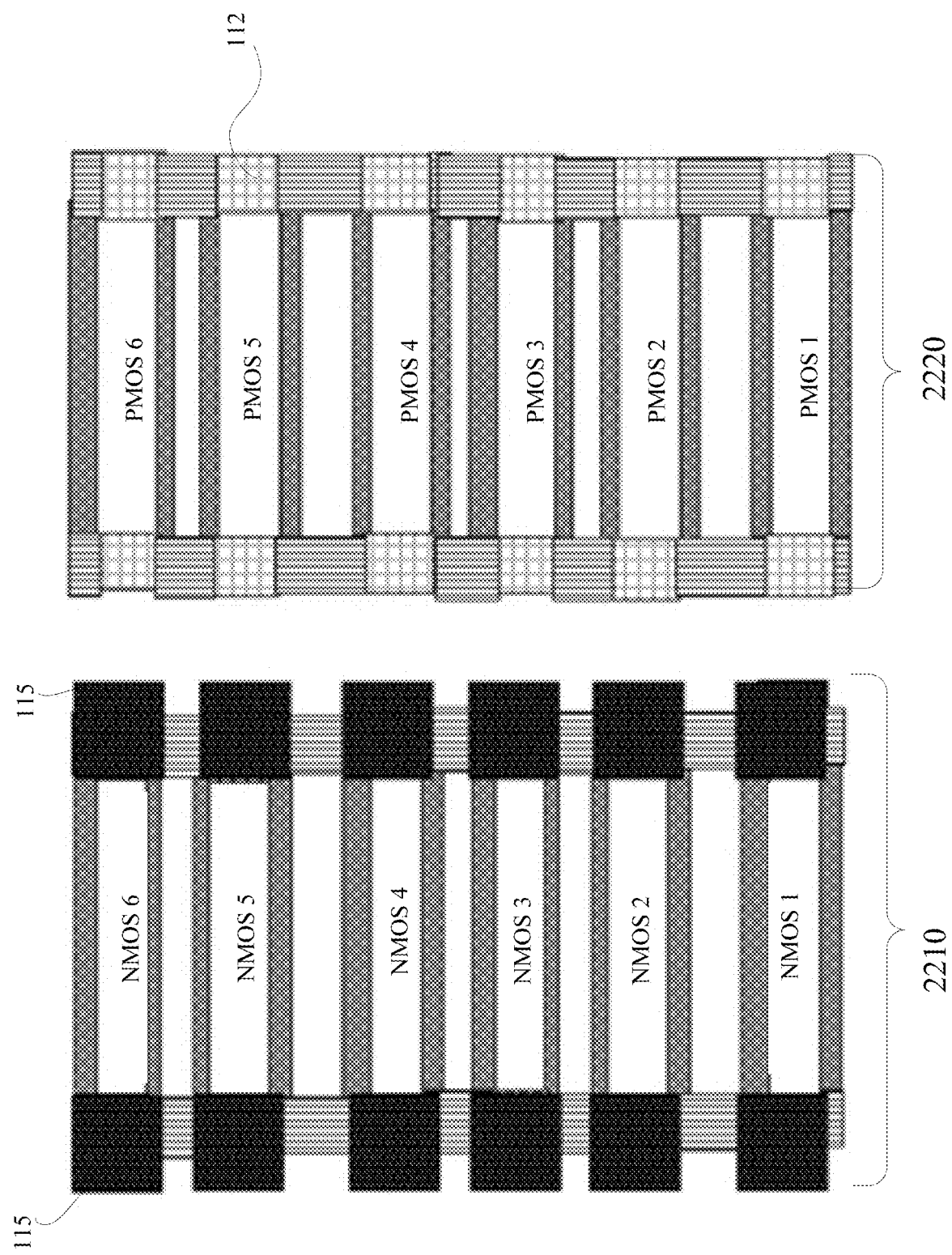
FIG. 25 shows fill material removed from the opposing ends of the PMOS nano-channels.

In FIG. 25, a reactive ion etch (RIE) selectively removes protective oxide fill 118 from stack 2220, exposing future P+ S/D regions 112.

Figure 26:
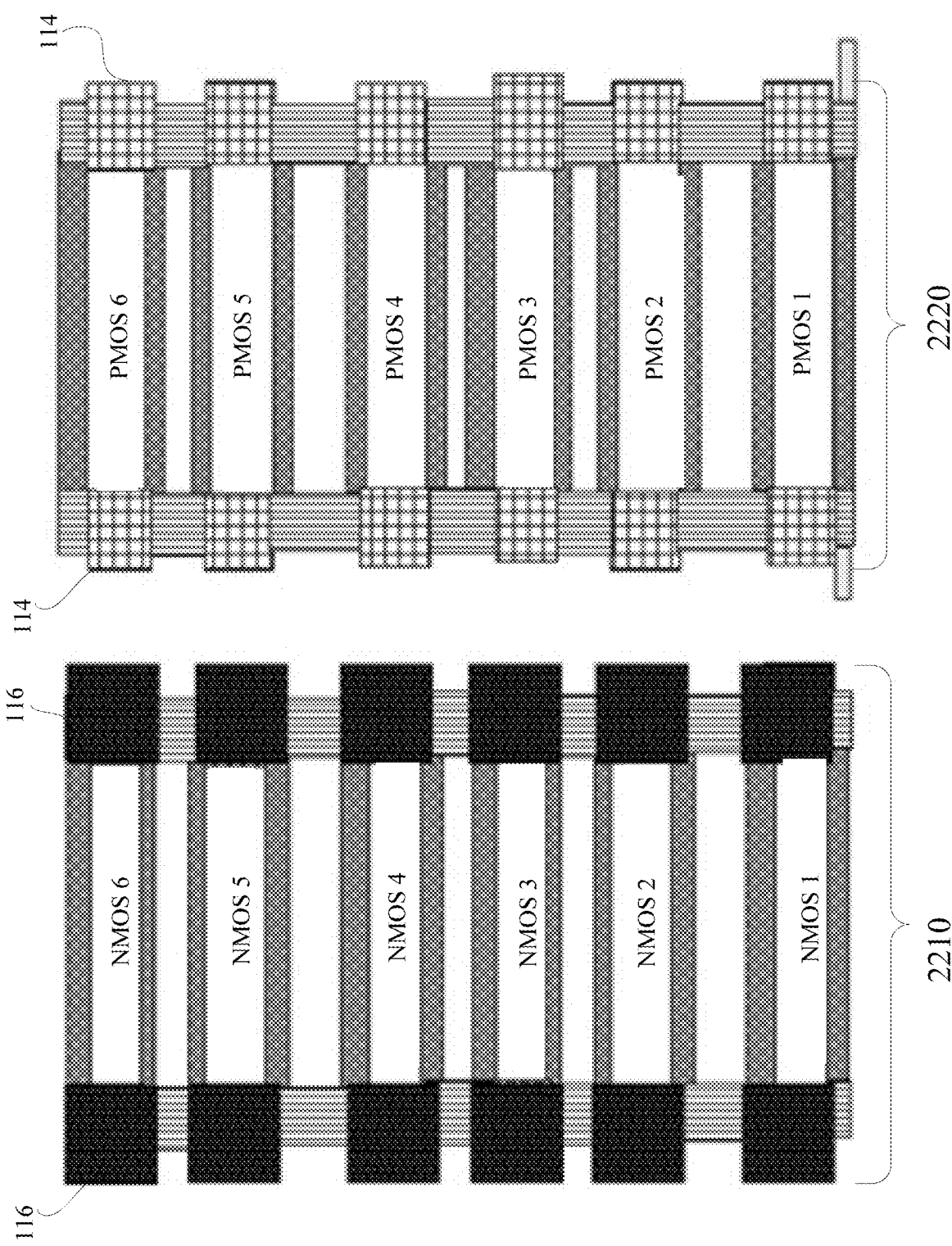
FIG. 26 shows P+ S/D formation on the uncovered ends of the right stack of 3D inverter cells of FIG. 25.

In FIG. 26, P+ epitaxial growth forms P+ S/D regions 114 on either side of each PMOS channel.

Figure 27:
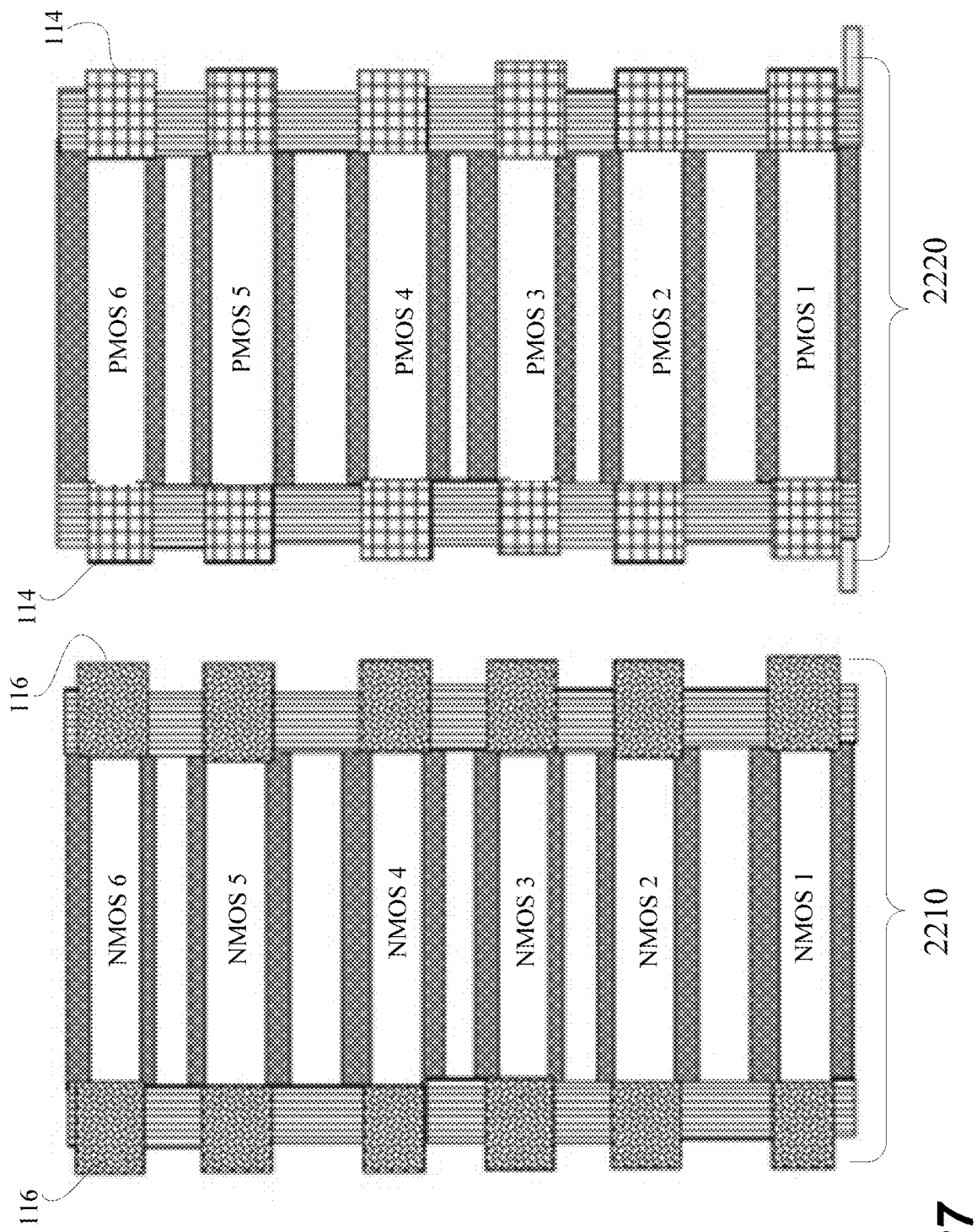
FIG. 27 shows the 3D stacked six tier inverter cell with all protective film removed.

FIG. 27 shows that the high-K protective deposition (or low temperature oxide) has been removed, forming six stacked CMOS inverters. Each NMOS transistor of stack 2210 has a channel with N+ S/D regions at its ends. Each PMOS transistor of stack 2220 has a channel with P+ S/D regions at its ends.

At this point, the process flow focuses on the replacement metal gate (RMG) steps to form gate oxides and work function metals. Additional steps to complete the stacked CMOS inverters can include forming local interconnects, followed by additional metallization (not shown). The completion process continues with established processes to finish with TiN, TaN, TiAl depositions, replacement metal gate P-type work function metal (RMG PWFM) removal, RMG final, gate cut, and forming M0 and M1 dual damascene metal layer horizontal and vertical connections.

With any of these flows, processing can continue as desired. For example, local interconnects can be completed as wells as gate oxide and gate electrode processing through a first metal layer. This can include replacement metal gate flow and conventional dual damascene metallization. Thus, techniques herein provide methods for making vertical stacks of GAA transistors with differing S/D doping types.

Further, any single nano-channel stack may be processed to have all nano-channel source/drain regions doped with the same dopant, that is, similar to the first nano-channel stack 110 of FIG. 9, or the stack 1010 of FIG. 21, which is a stack of identical nano-channel field effect transistors. Alternatively, any single nano-channel stack may be processed to have nano-channel S/D regions with alternating dopants, such as the stack 120 of FIG. 9, or the stack 1020 of FIG. 21.

The first embodiment is illustrated with respect to FIG. 1A, B, C, D, FIG. 2-FIG. 27. The first embodiment describes a method of fabricating a 3D stacked semiconductor device, the method comprising forming a plurality of nano-channel stacks on a substrate 108 (see FIG. 1B), each nano-channel stack including a plurality of nano-channels (M-M6, FIG. 1C) parallel to a surface plane (X, Y, FIG. 1B) of the substrate and aligned along a second plane perpendicular (Z) to the surface plane of the substrate, wherein each nano-channel of a stack is spaced apart from each other nano-channel of the stack (for example, M1 spaced apart from M3 by spacer 119, FIG. 1C), wherein each nano-channel has opposing ends (note ends 113 of nano-channel M5, FIG. 1C), wherein the plurality of nano-channel stacks are covered by a fill material 118, removing the fill material from at least one first nano-channel stack while at least one second nano-channel stack remains covered with the fill material (see FIG. 2), forming first source/drain regions 115 (FIG. 3) on the opposing ends of the at least one first nano-channel stack by an epitaxial growth process including a first dopant or a second dopant, depositing a protective film 116 (FIG. 4) on the first source/drain regions by a first selective deposition process which deposits the protective film on the first source/drain regions without depositing the protective film on other surfaces, from a top-down direction (in the direction of Z, FIG. 5), removing the fill material from a first portion of the opposing ends of the at least one second nano-channel stack, while one or more nano-channels positioned beneath the first portion remain covered, forming second source/drain regions 115 on the first portion by the epitaxial growth process including a first or a second dopant, depositing the protective film on the second source/drain regions (FIG. 6) by a second selective deposition process which deposits the protective film on the first source/drain regions without depositing the protective film on other surfaces, from the top-down direction, removing the fill material from a second portion (112, FIG. 7) of the opposing ends of the second nano-channel stack such that the opposing ends of at least one additional nano-channel are uncovered, forming third source/drain regions (114, FIG. 8) on the second portion by the epitaxial growth process including the first dopant or the second dopant, and removing the protective film (FIG. 9).

The method of the first embodiment further comprises prior to removing the fill material from the at least one first nano-channel stack, covering a top of at least one second nano-channel stack with a photoresist; and prior to removing the fill material from a first portion of the opposing ends of the at least one second nano-channel stack, removing the photoresist.

The method of the first embodiment includes a first alternative in which an SRAM cell is formed by doping the first source/drain regions with a first dopant, wherein the first dopant is an N+ dopant, doping the second source/drain regions with the first dopant and doping the third source/drain regions with the second dopant, wherein the second dopant is a P+ dopant.

The method of the first embodiment includes a second alternative in which an SRAM cell is formed by doping the first source/drain regions with the first dopant, wherein the first dopant is a P+ dopant, doping the second source/drain regions with the first dopant, doping the third source/drain regions with the second dopant, wherein the second dopant is a N+ dopant.

The method of the first embodiment includes a third alternative in which either an SRAM cell is formed by doping the first source/drain regions with the first dopant, wherein the first dopant is an N+ dopant, doping the second source/drain regions with the second dopant, wherein the second dopant is a P+ dopant, doping the third source/drain regions with the first dopant, or a fourth alternative in which an SRAM cell is formed by doping the first source/drain regions with a first dopant, wherein the first dopant is a P+ dopant, doping the second source/drain regions with the second dopant, wherein the second dopant is an N+ dopant, doping the third source/drain regions with the first dopant.

The method of the first embodiment includes a fifth alternative in which an inverter cell (FIG. 22A, 22B-27) is formed by doping the first source/drain regions with a first dopant, doping the second source/drain regions with the second dopant, doping the third source/drain regions with the second dopant, wherein the second and third source/drain regions equal all of the source/drain regions of the second stack.

The method of the first embodiment further comprises forming local interconnects on the first and second stack, forming additional metallization, depositing TiN, TaN and TiAl layers on the metallization, removing replacement metal gate P-type work function metal (RMG PWFM), forming a replacement metal gate (RMG), cutting each gate region of a stack from a gate region of another stack, and forming dual damascene metal layer horizontal and vertical connections.

The method of the first embodiment further comprises a sixth alternative in which a dual SRAM cell is formed (FIG. 10A, FIG. 10B-FIG. 21), prior to removing the protective film, by depositing the protective film on the third source/drain regions (FIG. 17) by a third selective deposition process which deposits the protective film on the third source/drain regions without depositing the protective film on other surfaces, from a top-down direction (see Z, FIG. 16), removing the fill material from a third portion of the at least one second nano-channel stack that uncovers the opposing ends of one or more fourth nano-channels beneath the second portion, forming fourth source/drain regions 115 (FIG. 18) on uncovered nano-channel ends of the third portion by epitaxial growth while doping the fourth source/drain regions with the first dopant or the second dopant, depositing the protective film 116 on the fourth source/drain regions (FIG. 19) by a fourth selective deposition process which deposits the protective film on the fourth source/drain regions without depositing the protective film on other surfaces, from a top-down direction, removing the fill material from a fourth portion of the at least one second nano-channel stack that uncovers the opposing ends 112 of one or more nano-channels beneath the third portion, forming fifth source/drain regions 114 (FIG. 20) on uncovered nano-channel ends of the fourth portion by epitaxial growth while doping the fifth source/drain regions with the first dopant or the second dopant.

The method of the sixth alternative includes doping the first source/drain regions with the first dopant, doping the second source/drain regions with the first dopant, doping the third source/drain regions with the second dopant, doping the fourth source/drain regions with the second dopant, and doping the fifth source/drain regions with the first dopant.

The method of the first embodiment includes a seventh alternative which forms a dual SRAM cell by doping the first source/drain regions with the first dopant, wherein the first dopant is an N+ dopant, doping the second source/drain regions with the first dopant, doping the third source/drain regions with the second dopant, wherein the second dopant is a P+ dopant, doping the fourth source/drain regions with the first dopant, and doping the fifth source/drain regions with the second dopant.

The method of the first embodiment includes an eighth alternative which forms a dual SRAM cell by doping the first source/drain regions with the first dopant, wherein the first dopant is a P+ dopant, doping the second source/drain regions with the first dopant, doping the third source/drain regions with the second dopant, wherein the second dopant is an N+ dopant, doping the fourth source/drain regions with the first dopant, and doping the fifth source/drain regions with the second dopant.

The method of the first embodiment includes a ninth alternative which forms a dual SRAM cell by depositing the protective film on the fifth source/drain regions by a sixth selective deposition process which deposits the protective film on the fifth source/drain regions without depositing the protective film on other surfaces, in a top-down manner, forming further doped source/drain regions beneath the fifth source/drain regions of the at least one second nano-channel stack by stepwise incremental removal of the fill material from one or more opposing ends, each incremental removal followed by epitaxially growing doped source/drain regions on the one or more opposing ends, wherein the source/drain regions are alternately doped with the first dopant or a second dopant, selectively depositing a protective film on the doped source/drain regions before uncovering additional opposing ends in the second nano-channel stack, wherein the protective film is selectively deposited only on the doped source/drain regions, and removing the protective film after completing source/drain formation on all of the nano-channel opposing ends of the second nano-channel stack.

The second embodiment is illustrated with respect to FIG. 22A, 22B-FIG. 27. The second embodiment describes a method of fabricating a 3D stacked inverter, the method comprising forming a plurality of nano-channel stacks (2210, 2220, FIG. 22B) on a substrate 2205, each nano-channel stack including a plurality of nano-channels (NMOS 1-NMOS 6; PMOS 1-PMOS 6, FIG. 22B) parallel to a surface plane of the substrate and aligned along a second plane perpendicular to the surface plane of the substrate (note nano-channel for NMOS 1 parallel to substrate 2205, FIG. 22B), wherein each nano-channel is spaced apart from each other nano-channel (for example, NMOS 1 spaced apart from NMOS 2 by spacer 119), wherein each nano-channel has opposing ends, wherein the plurality of nano-channel stacks are covered by a fill material 118, removing the fill material from a first nano-channel stack while a second nano-channel stack remains covered with the fill material and forming first source/drain regions 115 (FIG. 23) on nano-channel ends of the first nano-channel stack by a first epitaxial growth process and a first dopant, depositing a protective film 116 on the first source/drain regions by a selective deposition process that deposits on the first source/drain regions without depositing the protective film on other surfaces (FIG. 24), removing the fill material from a second nano-channel stack (FIG. 25), forming second source/drain regions 114 on the opposing ends of the second nano-channel stack by a second epitaxial growth process and a second dopant (FIG. 26), and removing the protective film (FIG. 27).

The third embodiment is illustrated with respect to FIG. 1A, B, C, D, FIG. 2-FIG. 27. The third embodiment describes a method for fabricating a 3D stacked semiconductor device, the method forming a plurality (FIG. 1B) of nano-channel stacks on a substrate 108 (see FIG. 1B), each nano-channel stack (110, 120, for example, FIG. 1C) including a plurality of nano-channels (M-M6, FIG. 1C) parallel to a surface plane (X, Y, FIG. 1B) of the substrate and aligned along a second plane (Z) perpendicular to the surface plane of the substrate, wherein each nano-channel in a stack is spaced apart from each other nano-channel in the stack (for example, M1 spaced apart from M3 by spacer 119, FIG. 1C), wherein each nano-channel has opposing ends (note ends 113 of nano-channel M5, FIG. 1C), wherein the plurality of nano-channel stacks are covered by a fill material 118. The method of the third embodiment further comprises, in a top-down direction, removing the fill material from the opposing ends of a first portion of a first nano-channel stack while the opposing ends of the nano-channels positioned beneath the first portion remain covered with the fill material, forming first source/drain regions on the opposing ends of the first portion by epitaxial growth while doping the first source/drain regions with a first dopant or a second dopant, depositing a protective film on the first source/drain regions by a first selective deposition process that deposits the protective film on the first source/drain regions without depositing the protective film on other surfaces. From the top-down direction, removing the fill material from a second portion of the opposing ends of the first nano-channel stack while the opposing ends of nano-channels positioned beneath the second portion remain covered, forming second source/drain regions on the opposing ends of the second portion of the first nano-channel stack by epitaxial growth while doping the second source/drain regions with the first dopant or the second dopant, depositing the protective film on the second source/drain regions by a second selective deposition process that deposits the protective film on the second source/drain regions without depositing the protective film on other surfaces. From the top-down direction, removing the fill material from a third portion of the first nano-channel stack that uncovers the opposing ends of one or more third nano-channels, forming third source/drain regions on uncovered nano-channel ends of the third portion of the first nano-channel stack by epitaxial growth while doping the third source/drain regions with the first dopant or the second dopant, and removing the protective film from all source/drain regions of the first nano-channel stack.

The method of the third embodiment includes a first alternative of doping the first source/drain regions with the first dopant, wherein the first dopant is an N+ dopant, doping the second source/drain regions with the second dopant, wherein the second dopant is a P+ dopant, and doping the third source/drain regions with the first dopant.

The method of the third embodiment includes a second alternative of doping the first source/drain regions with the first dopant, wherein the first dopant is a P+ dopant, doping the second source/drain regions with the second dopant, wherein the second dopant is an N+ dopant, and doping the third source/drain regions with the first dopant.

The method of the third embodiment further comprises local interconnects on the first nano-channel stack, forming additional metallization, depositing TiN, TaN and TiAl layers on the metallization, removing replacement metal gate P-type work function metal (RMG PWFM), forming a replacement metal gate (RMG), cutting each gate region of a stack from a gate region of another stack, and forming dual damascene metal layer horizontal and vertical connections.

The method of the third embodiment further comprises a third alternative in which, prior to removing the protective film, depositing the protective film on the third source/drain regions by a third selective deposition process which deposits the protective film on the third source/drain regions without depositing the protective film on other surfaces, in a top-down manner, forming further doped source/drain regions beneath the third portion of the first nano-channel stack by stepwise incremental removal of the fill material from one or more portions of opposing ends of the first nano-channel stack, each incremental removal followed by epitaxial growth of source/drain regions on the one or more opposing ends while alternately doping the opposing ends of each portion with the first dopant or the second dopant, selectively depositing a protective film on the source/drain regions each portion before uncovering additional opposing ends in the first nano-channel stack, wherein the protective film is selectively deposited only on the source/drain regions of the portion, and removing the protective film after completing source/drain formation on all of the nano-channel opposing ends of the first nano-channel stack.

The method of the third embodiment further comprises a fourth alternative in which, prior to removing the protective film, depositing the protective film on the third source/drain regions by a third selective deposition process which deposits the protective film on the third source/drain regions without depositing the protective film on other surfaces, from a top-down direction, removing the fill material from the opposing ends of a fourth portion of the first nano-channel stack while the opposing ends of nano-channels positioned beneath the fourth portion remain covered, forming fourth source/drain regions on the opposing ends of the fourth portion by epitaxial growth while doping the fourth source/drain regions with the first dopant or the second dopant, depositing the protective film on the fourth source/drain regions by a fourth selective deposition process which deposits the protective film on the fourth source/drain regions without depositing the protective film on other surfaces, from a top-down direction, removing the fill material from the opposing ends of a fifth portion of the first nano-channel stack while the opposing ends of nano-channels positioned beneath the fifth portion remain covered, forming fifth source/drain regions on the opposing ends of the fifth portion by epitaxial growth while doping the fifth source/drain regions with the first dopant or the second dopant, depositing the protective film on the fifth source/drain regions by a fifth selective deposition process which deposits the protective film on the fifth source/drain regions without depositing the protective film on other surfaces, from a top-down direction, removing the fill material from the opposing ends of a sixth portion of the first nano-channel stack, forming sixth source/drain regions on the opposing ends of the sixth portion by epitaxial growth while doping the sixth source/drain regions with the first dopant or the second dopant.

The fourth alternative further comprises doping the first source/drain regions with the first dopant, doping the second source/drain regions with the second dopant, doping the third source/drain regions with the first dopant, doping the fourth source/drain regions with the second dopant, doping the fifth source/drain regions with the first dopant, doping the sixth source/drain regions with the second dopant, wherein the first dopant is one of an N+ dopant and a P+ dopant and the second dopant is one of an N+ dopant and a P+ dopant.

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts may be executed independently of each other or in combination with each other. Accordingly, the aspects of the present disclosure may be embodied and viewed in many different ways.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of fabricating a 3D stacked semiconductor device, the method comprising:
   forming a plurality of nano-channel stacks on a substrate, each nano-channel stack including a plurality of nano-channels parallel to a surface plane of the substrate and aligned along a second plane perpendicular to the surface plane of the substrate, wherein each nano-channel of a stack is spaced apart from each other nano-channel of the stack, wherein each nano-channel has opposing ends, wherein the plurality of nano-channel stacks are covered by a fill material;
   removing the fill material from at least one first nano-channel stack while at least one second nano-channel stack remains covered with the fill material;
   forming first source/drain regions on the opposing ends of the at least one first nano-channel stack by a first epitaxial growth process including a first dopant or a second dopant;
   depositing a protective film on the first source/drain regions by a first selective deposition process which deposits the protective film on the first source/drain regions without depositing the protective film on other surfaces;
   from a top-down direction, removing the fill material from a first portion of the opposing ends of the at least one second nano-channel stack, while one or more nano-channels positioned beneath the first portion remain covered;
   forming second source/drain regions on the first portion by a second epitaxial growth process including a first or a second dopant;
   depositing the protective film on the second source/drain regions by a second selective deposition process which deposits the protective film on the first source/drain regions without depositing the protective film on other surfaces;
   from the top-down direction, removing the fill material from a second portion of the opposing ends of the second nano-channel stack such that the opposing ends of at least one additional nano-channel are uncovered;
   forming third source/drain regions on the second portion by a third epitaxial growth process including the first dopant or the second dopant; and
   removing the protective film.

2. The method of claim 1, further comprising,
   prior to removing the fill material from the at least one first nano-channel stack, covering a top of at least one second nano-channel stack with a photoresist; and
   prior to removing the fill material from a first portion of the opposing ends of the at least one second nano-channel stack, removing the photoresist.

3. The method of claim 1, comprising:
   doping the first source/drain regions with the first dopant, wherein the first dopant is an N+ dopant;
   doping the second source/drain regions with the first dopant; and
   doping the third source/drain regions with the second dopant, wherein the second dopant is a P+ dopant.

4. The method of claim 1, comprising:
   doping the first source/drain regions with the first dopant, wherein the first dopant is a P+ dopant;
   doping the second source/drain regions with the first dopant; and
   doping the third source/drain regions with the second dopant, wherein the second dopant is a N+ dopant.

5. The method of claim 1, further comprising either:
   doping the first source/drain regions with the first dopant, wherein the first dopant is an N+ dopant;
   doping the second source/drain regions with the second dopant, wherein the second dopant is a P+ dopant;
   doping the third source/drain regions with the first dopant; or
   doping the first source/drain regions with the first dopant, wherein the first dopant is a P+ dopant;
   doping the second source/drain regions with the second dopant, wherein the second dopant is an N+ dopant; and
   doping the third source/drain regions with the first dopant.

6. The method of claim 1, comprising:
doping the first source/drain regions with the first dopant;
doping the second source/drain regions with the second dopant; and
doping the third source/drain regions with the second dopant, wherein the second and third source/drain regions equal all of the source/drain regions of the second stack.

7. The method of claim 1, further comprising:
forming local interconnects on the first nano-channel stack and the second nano-channel stack;
forming additional metallization;
depositing TiN, TaN and TiAl layers on the metallization;
removing replacement metal gate P-type work function metal (RMG PWFM);
forming a replacement metal gate (RMG);
cutting each gate region of a stack from a gate region of another stack; and
forming dual damascene metal layer horizontal and vertical connections.

8. The method of claim 1, further comprising, prior to removing the protective film;
depositing the protective film on the third source/drain regions by a third selective deposition process which deposits the protective film on the third source/drain regions without depositing the protective film on other surfaces;
from a top-down direction, removing the fill material from a third portion of the at least one second nano-channel stack that uncovers the opposing ends of one or more fourth nano-channels beneath the second portion;
forming fourth source/drain regions on uncovered nano-channel ends of the third portion by a fourth epitaxial growth process which dopes the fourth source/drain regions with the first dopant or the second dopant;
depositing the protective film on the fourth source/drain regions by a fourth selective deposition process which deposits the protective film on the fourth source/drain regions without depositing the protective film on other surfaces;
from a top-down direction, removing the fill material from a fourth portion of the at least one second nano-channel stack that uncovers the opposing ends of one or more nano-channels beneath the third portion; and
forming fifth source/drain regions on uncovered nano-channel ends of the fourth portion by a fifth epitaxial growth process which dopes the fifth source/drain regions with the first dopant or the second dopant.

9. The method of claim 8, further comprising:
doping the first source/drain regions with the first dopant;
doping the second source/drain regions with the first dopant;
doping the third source/drain regions with the second dopant;
doping the fourth source/drain regions with the first dopant or the second dopant; and
doping the fifth source/drain regions with the first dopant.

10. The method of claim 8, comprising:
doping the first source/drain regions with the first dopant, wherein the first dopant is an N+ dopant;
doping the second source/drain regions with the first dopant;
doping the third source/drain regions with the second dopant, wherein the second dopant is a P+ dopant;
doping the fourth source/drain regions with the first dopant; and
doping the fifth source/drain regions with the second dopant.

11. The method of claim 8, comprising:
doping the first source/drain regions with the first dopant, wherein the first dopant is a P+ dopant;
doping the second source/drain regions with the first dopant;
doping the third source/drain regions with the second dopant, wherein the second dopant is an N+ dopant;
doping the fourth source/drain regions with the first dopant or the second dopant; and
doping the fifth source/drain regions with the second dopant.

12. The method of claim 8, further comprising:
depositing the protective film on the fifth source/drain regions by a fifth selective deposition process which deposits the protective film on the fifth source/drain regions without depositing the protective film on other surfaces;
in a top-down manner, forming further doped source/drain regions beneath the fifth source/drain regions of the at least one second nano-channel stack by:
stepwise incremental removal of the fill material from one or more opposing ends, each incremental removal followed by epitaxially growing doped source/drain regions on the one or more opposing ends, wherein the doped source/drain regions are alternately doped with the first dopant or the second dopant;
selectively depositing a protective film on the doped source/drain regions before uncovering additional opposing ends in the second nano-channel stack,
wherein the protective film is selectively deposited only on the doped source/drain regions; and
removing the protective film after completing source/drain formation on all of the nano-channel opposing ends of the second nano-channel stack.

13. A method of fabricating a 3D stacked inverter, the method comprising:
forming a plurality of nano-channel stacks on a substrate, each nano-channel stack including a plurality of nano-channels parallel to a surface plane of the substrate and aligned along a second plane perpendicular to the surface plane of the substrate, wherein each nano-channel is spaced apart from each other nano-channel, wherein each nano-channel has opposing ends, wherein the plurality of nano-channel stacks are covered by a fill material;
removing the fill material from a first nano-channel stack while a second nano-channel stack remains covered with the fill material;
forming first source/drain regions on nano-channel ends of the first nano-channel stack by a first epitaxial growth process including a first dopant;
depositing a protective film on the first source/drain regions by a selective deposition process that deposits on the first source/drain regions without depositing the protective film on other surfaces;
removing the fill material from a second nano-channel stack;
forming second source/drain regions on the opposing ends of the second nano-channel stack by a second epitaxial growth process including a second dopant; and
removing the protective film.

14. A method of fabricating a 3D stacked semiconductor device, the method comprising:

forming a plurality of nano-channel stacks on a substrate, each nano-channel stack including a plurality of nano-channels parallel to a surface plane of the substrate and aligned along a second plane perpendicular to the surface plane of the substrate, wherein each nano-channel is spaced apart from each other nano-channel, wherein each nano-channel has opposing ends, wherein the plurality of nano-channel stacks are covered by a fill material;

from a top-down direction, removing the fill material from the opposing ends of a first portion of a first nano-channel stack while the opposing ends of the nano-channels positioned beneath the first portion remain covered with the fill material;

forming first source/drain regions on the opposing ends of the first portion by epitaxial growth while doping the first source/drain regions with a first dopant or a second dopant;

depositing a protective film on the first source/drain regions by a first selective deposition process that deposits the protective film on the first source/drain regions without depositing the protective film on other surfaces;

from the top-down direction, removing the fill material from a second portion of the opposing ends of the first nano-channel stack while the opposing ends of nano-channels positioned beneath the second portion remain covered;

forming second source/drain regions on the opposing ends of the second portion of the first nano-channel stack by epitaxial growth while doping the second source/drain regions with the first dopant or the second dopant;

depositing the protective film on the second source/drain regions by a second selective deposition process that deposits the protective film on the second source/drain regions without depositing the protective film on other surfaces;

from the top-down direction, removing the fill material from a third portion of the first nano-channel stack that uncovers the opposing ends of one or more third nano-channels;

forming third source/drain regions on uncovered nano-channel ends of the third portion of the first nano-channel stack by epitaxial growth while doping the third source/drain regions with the first dopant or the second dopant; and removing the protective film from all source/drain regions of the first nano-channel stack.

15. The method of claim 14,
doping the first source/drain regions with the first dopant, wherein the first dopant is an N+ dopant;
doping the second source/drain regions with the second dopant, wherein the second dopant is a P+ dopant; and
doping the third source/drain regions with the first dopant.

16. The method of claim 14,
doping the first source/drain regions with the first dopant, wherein the first dopant is a P+ dopant;
doping the second source/drain regions with the second dopant, wherein the second dopant is an N+ dopant; and
doping the third source/drain regions with the first dopant.

17. The method of claim 14, further comprising:
forming local interconnects on the first nano-channel stack;
forming additional metallization;
depositing TiN, TaN and TiAl layers on the metallization;
removing replacement metal gate P-type work function metal (RMG PWFM);
forming a replacement metal gate (RMG);
cutting each gate region of a stack from a gate region of another stack; and
forming dual damascene metal layer horizontal and vertical connections.

18. The method of claim 14, further comprising, prior to removing the protective film:
depositing the protective film on the third source/drain regions by a third selective deposition process which deposits the protective film on the third source/drain regions without depositing the protective film on other surfaces;
in a top-down manner, forming further doped source/drain regions beneath the third portion of the first nano-channel stack by:
stepwise incremental removal of the fill material from one or more portions of opposing ends of the first nano-channel stack, each incremental removal followed by epitaxial growth of source/drain regions on the one or more opposing ends while alternately doping the opposing ends of each portion with the first dopant or the second dopant;
selectively depositing a protective film on the source/drain regions each portion before uncovering additional opposing ends in the first nano-channel stack, wherein the protective film is selectively deposited only on the source/drain regions of the portion; and
removing the protective film after completing source/drain formation of all of the nano-channel opposing ends of the first nano-channel stack.

19. The method of claim 14, comprising, prior to removing the protective film:
depositing the protective film on the third source/drain regions by a third selective deposition process which deposits the protective film on the third source/drain regions without depositing the protective film on other surfaces;
from a top-down direction, removing the fill material from the opposing ends of a fourth portion of the first nano-channel stack while the opposing ends of nano-channels positioned beneath the fourth portion remain covered;
forming fourth source/drain regions on the opposing ends of the fourth portion by epitaxial growth while doping the fourth source/drain regions with the first dopant or the second dopant;
depositing the protective film on the fourth source/drain regions by a fourth selective deposition process which deposits the protective film on the fourth source/drain regions without depositing the protective film on other surfaces;
from a top-down direction, removing the fill material from the opposing ends of a fifth portion of the first nano-channel stack while the opposing ends of nano-channels positioned beneath the fifth portion remain covered;
forming fifth source/drain regions on the opposing ends of the fifth portion by epitaxial growth while doping the fifth source/drain regions with the first dopant or the second dopant;
depositing the protective film on the fifth source/drain regions by a fifth selective deposition process which deposits the protective film on the fifth source/drain regions without depositing the protective film on other surfaces;

from a top-down direction, removing the fill material from the opposing ends of a sixth portion of the first nano-channel stack; and forming sixth source/drain regions on the opposing ends of the sixth portion by epitaxial growth while doping the sixth source/drain regions with the first dopant or the second dopant.

20. The method of claim 19, further comprising:

doping the first source/drain regions with the first dopant;

doping the second source/drain regions with the second dopant;

doping the third source/drain regions with the first dopant;

doping the fourth source/drain regions with the second dopant;

doping the fifth source/drain regions with the first dopant; and doping the sixth source/drain regions with the second dopant, wherein the first dopant is one of an N+ dopant and a P+ dopant and the second dopant is one of an N+ dopant and a P+ dopant.

\* \* \* \* \*